US009910331B2

(12) United States Patent
Miyamoto et al.

(10) Patent No.: US 9,910,331 B2
(45) Date of Patent: Mar. 6, 2018

(54) DISPLAY DEVICE

(71) Applicant: Japan Display Inc., Tokyo (JP)

(72) Inventors: Motoharu Miyamoto, Tokyo (JP); Teppei Yamada, Tokyo (JP); Yasuhiro Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 44 days.

(21) Appl. No.: 14/844,464

(22) Filed: Sep. 3, 2015

(65) Prior Publication Data

US 2016/0071884 A1 Mar. 10, 2016

(30) Foreign Application Priority Data

Sep. 5, 2014 (JP) ................. 2014-181239

(51) Int. Cl.
*G02F 1/1362* (2006.01)
*H01L 27/12* (2006.01)
*G02F 1/1368* (2006.01)

(52) U.S. Cl.
CPC .. *G02F 1/136227* (2013.01); *G02F 1/136286* (2013.01); *H01L 27/1251* (2013.01); *G02F 1/1362* (2013.01); *G02F 1/1368* (2013.01); *H01L 27/124* (2013.01); *H01L 27/1222* (2013.01)

(58) Field of Classification Search
CPC ................. G02F 1/1362; G02F 1/1368; G02F 1/136227; G02F 1/136286; H01L 27/1251
See application file for complete search history.

(56) References Cited

U.S. PATENT DOCUMENTS

2011/0025971 A1* 2/2011 Fujikawa .......... G02F 1/136227
349/149
2013/0148049 A1 6/2013 Abe et al.

FOREIGN PATENT DOCUMENTS

JP 2013-083679 A 5/2013

* cited by examiner

*Primary Examiner* — Dung Nguyen
(74) *Attorney, Agent, or Firm* — Typha IP LLC

(57) ABSTRACT

A display device is provided with a pixel and a dummy pixel including a gate line and a signal line. The dummy pixel includes the gate line and a dummy semiconductor layer crossing the gate line through an insulating layer. The dummy semiconductor layer is electrically separated from the dummy semiconductor layer of the dummy pixel adjacent in the Y direction dummy pixel. The dummy pixel further includes a dummy signal line extending in the Y direction. The dummy signal line is connected to the dummy semiconductor layer through a plurality of contact holes. The contact holes are arranged with the gate line interposed between them in plan view.

11 Claims, 23 Drawing Sheets

DISPLAY DEVICE

CLAIM OF PRIORITY

The present application claims priority from Japanese patent application JP2014-181239 filed on Sep. 5, 2014, the content of which is hereby incorporated by reference into this application.

BACKGROUND

This disclosure relates to a display device and can be applied to, for example, a display device having a dummy pixel.

In the end portion of a display area, dummy pixels are arranged outside of the display area so that a constitutional change in the end portion and its electromagnetic change should not affect the display. Further, the dummy pixels can also avoid an electrostatic damage (electrostatic discharge (ESD) damage) caused by the static electricity generated in the manufacturing time (for example, Japanese Patent Publication Laid-Open No. 2013-83679).

SUMMARY

These days, inch size of a display device for a tablet terminal and a smartphone comparatively gets larger and the length of each wiring drawn around gets longer; as the result, a charge amount of the wiring is increased and an element within the display area may be broken disadvantageously.

Other objects and novel features will be apparent from the description of the disclosure and the attached drawings.

Of the disclosure, outline of the typical one will be briefly described as follows.

A display device has a plurality of pixels, a display area for displaying images, and a dummy pixel area including a plurality of dummy pixels, which is arranged outside of the display area. The pixel includes a thin film transistor having a first semiconductor layer, a gate line extending in a first direction, which is connected to the gate of the thin film transistor, and a signal line extending in a second direction different from the first direction, which is connected to the drain of the thin film transistor. The dummy pixel includes the gate line, a first insulating layer, and a second semiconductor layer crossing the gate line through the first insulating layer. The second semiconductor layer is electrically separated from the second semiconductor layer of the dummy pixel adjacent in the second direction.

DESCRIPTION OF THE PREFERRED EMBODIMENTS

Figure 1:
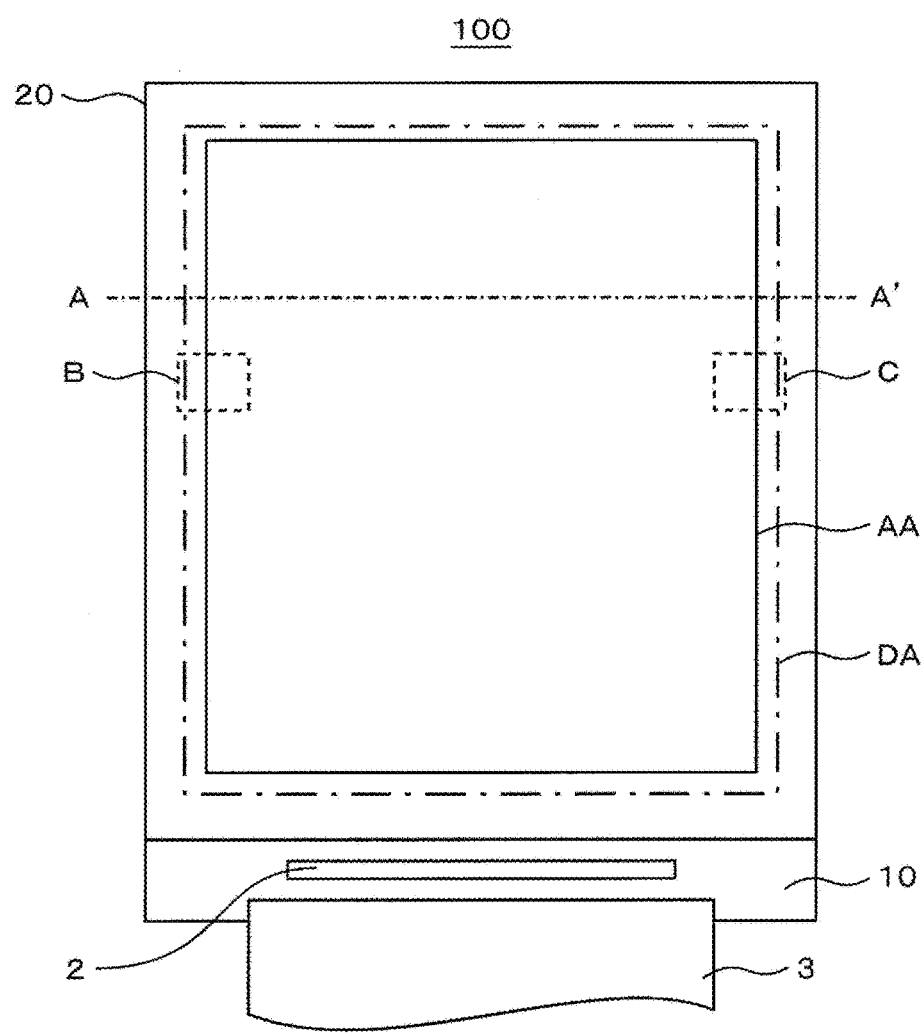
FIG. 1 is a top plan view for use in describing a display device according to an embodiment.

A dummy pixel has the same structure as a pixel within a display area or the structure partially omitted from the pixel and the dummy pixels are arranged outside of the display area adjacently to the display area. A pixel includes a thin film transistor (Thin Film Transistor (TFT)), a gate line (also referred to as a scanning line) connected to a gate of the TFT, a signal line (also referred to as a video signal line, a drain line, or a source line) connected to a drain (or a source) of the TFT, a pixel electrode connected to the source (or the drain) of the TFT, and a common electrode which applies a voltage to a liquid crystal together with a pixel electrode. The dummy pixels are arranged outside of the display area in the direction of extending a gate line (hereinafter, referred to as a first dummy pixel area) and in the direction of extending a signal line (hereinafter, referred to as a second dummy pixel area). A dummy signal line extends in the first dummy pixel area and a dummy gate line extends in the second dummy pixel area.

A display device according to one embodiment includes pixels (PI, PIA, PIC) within the display area and dummy pixels (DP, DPA, DPB, DPC, DPD, DPE, DPF, DPG, DPH). The dummy pixel includes a gate line (106, 106C) and a dummy semiconductor layer (104D, 104DA, 104DC, 104DE, 104DG) arranged to cross the gate line. The gate line of the dummy pixel is shared with the gate of the pixel. The dummy semiconductor layer is electrically separated in every dummy pixel.

According to the display device of the embodiment, the gate line crosses the dummy semiconductor layer of the dummy pixel, and therefore, even when static electricity occurs in the manufacturing time, ESD occurs between the gate line and the dummy semiconductor. According to this, ESD damage can be avoided between the gate line and the semiconductor of the pixel within the display area.

Hereinafter, one embodiment and modified examples will be described with reference to the drawings. The disclosure is only an example and various changes properly made within the spirit of the invention and easily arrived at by those skilled in the art would be naturally included in the scope of the invention. Further, in order to make the description clearer, the width, thickness, and shape of each unit are schematically shown in the drawings, compared with the actual form; however, these are only example and not to restrict the interpretation of the invention. The same reference numerals and signs are attached to the same elements having been described in the previous drawing and the detailed description thereof is properly omitted. Although in the following embodiment, a display device using a liquid crystal will be described, it is not restricted to this but any display device will do as far as it uses a thin film transistor of organic EL and the like.

Embodiment

One embodiment will be described using FIGS. 1 to 7.

Figure 2:
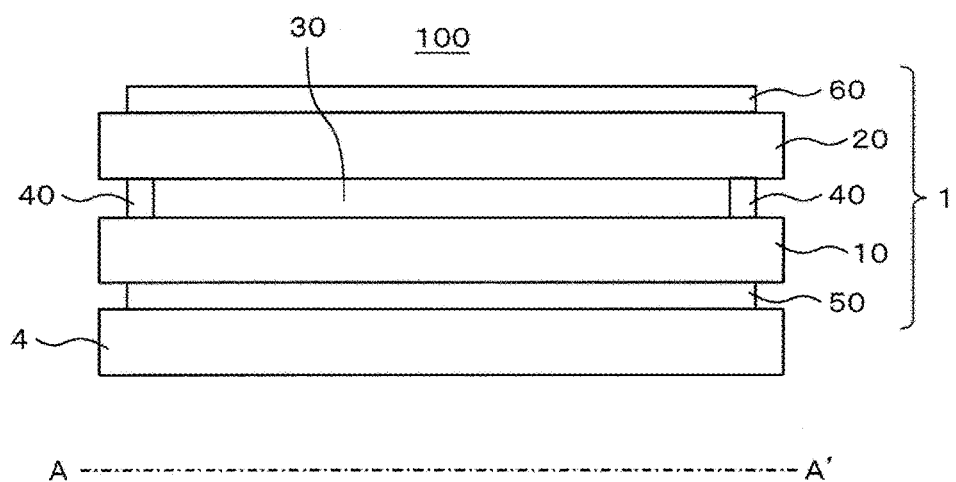
FIG. 2 is a cross-sectional view taken along the line A-A' of FIG. 1.
Figure 3:
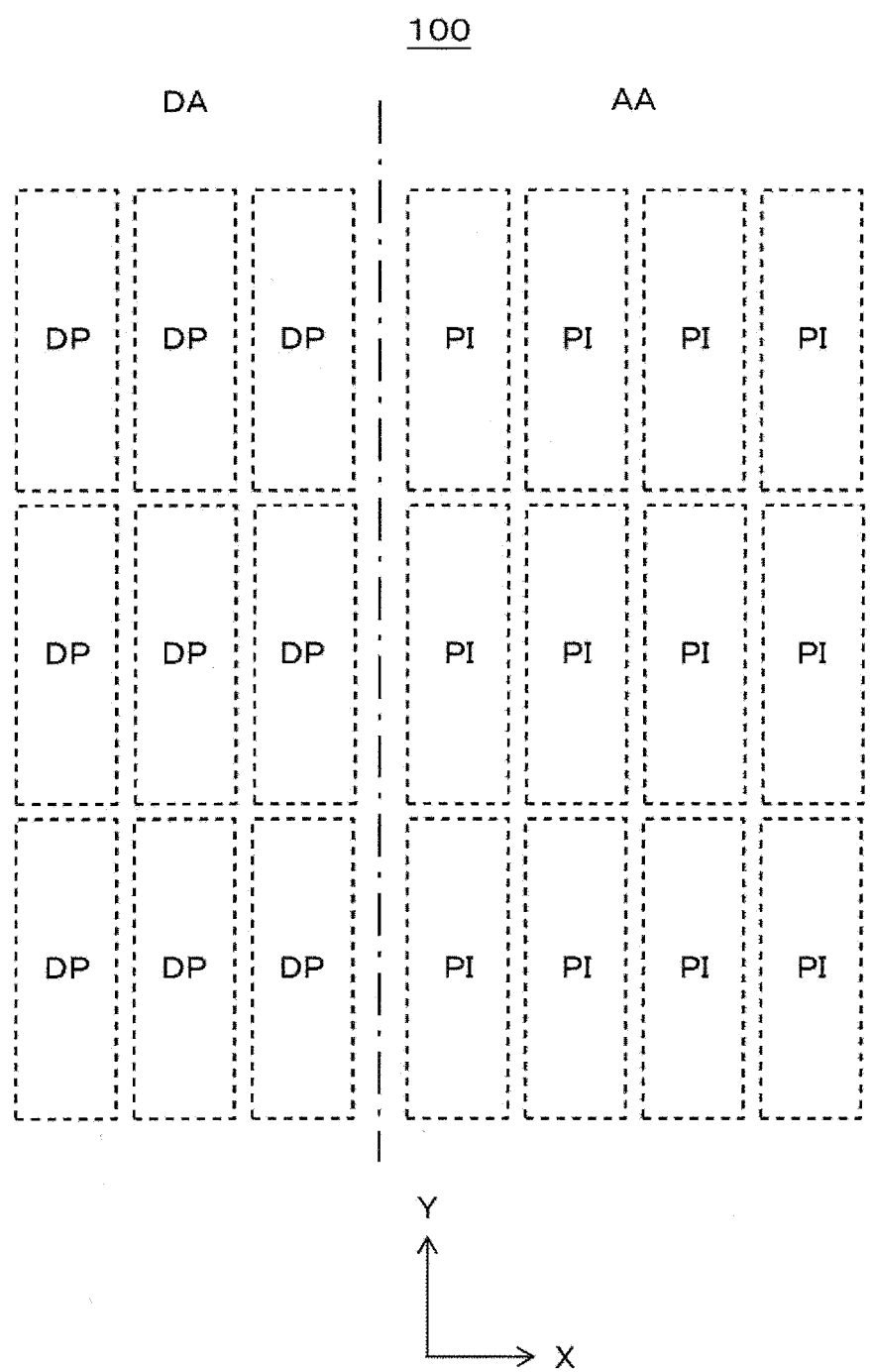
FIG. 3 is a top plan view for use in describing the portion of the dotted line B of FIG. 1.
Figure 4:
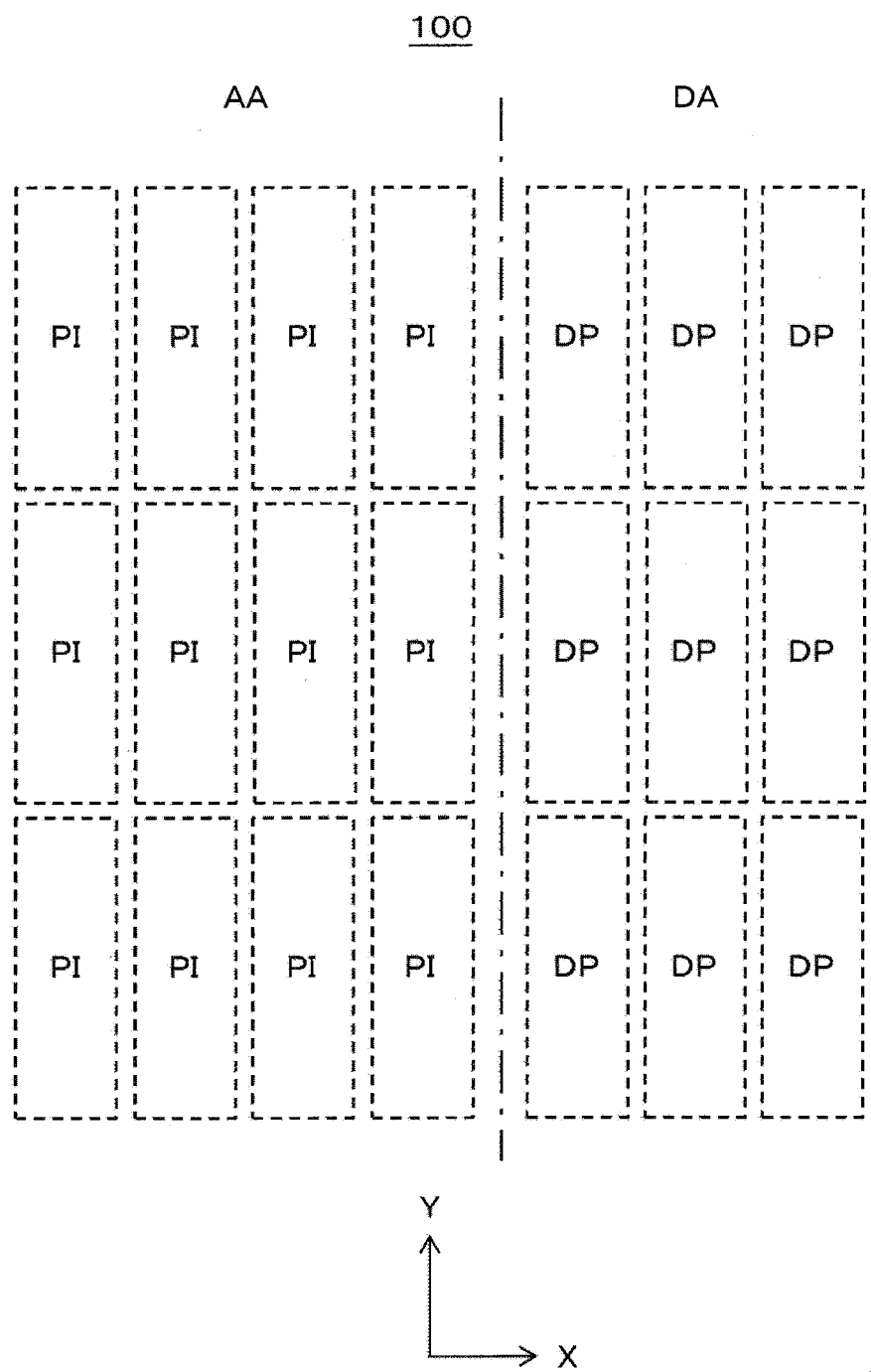
FIG. 4 is a top plan view for use in describing the portion of the dotted line C of FIG. 1.
Figure 5:
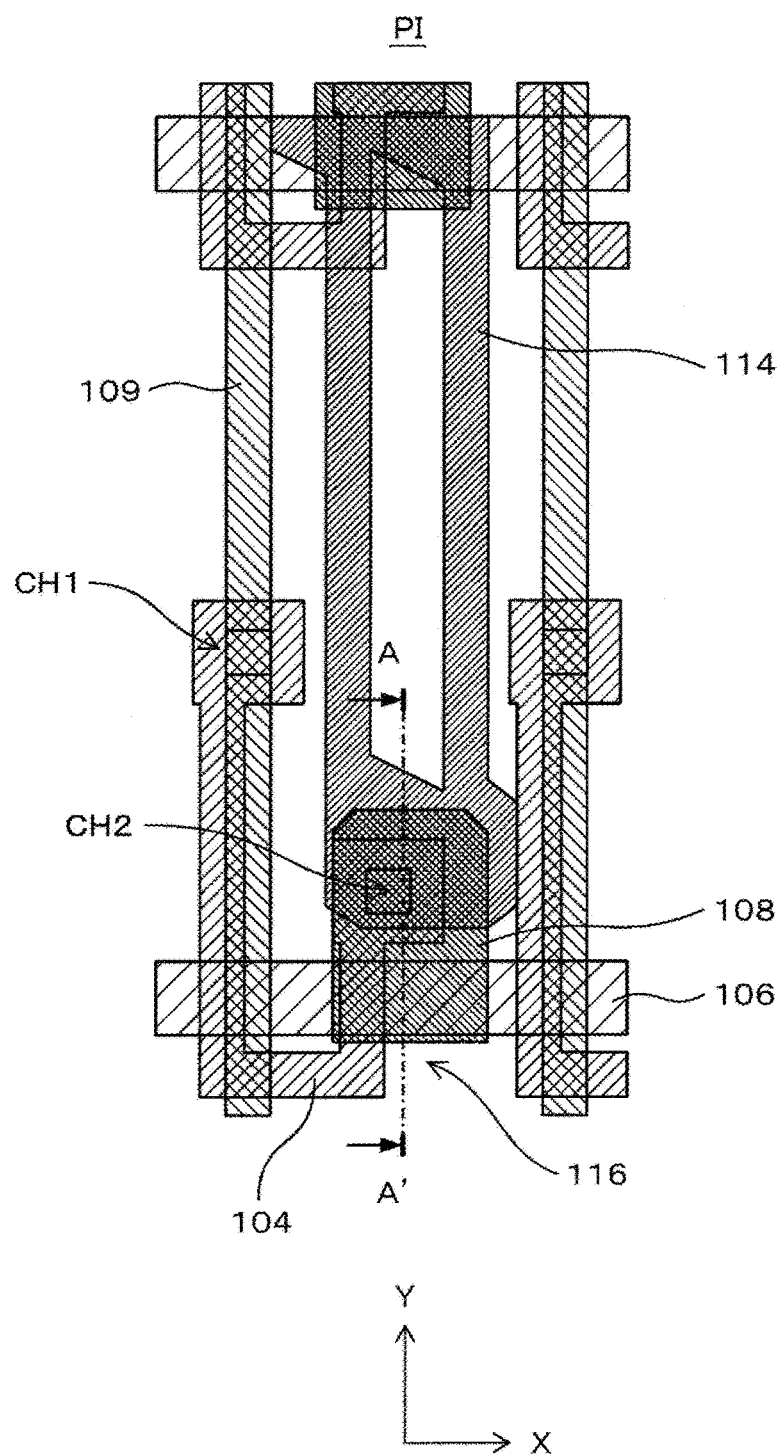
FIG. 5 is a top plan view for use in describing a pixel.
Figure 6:
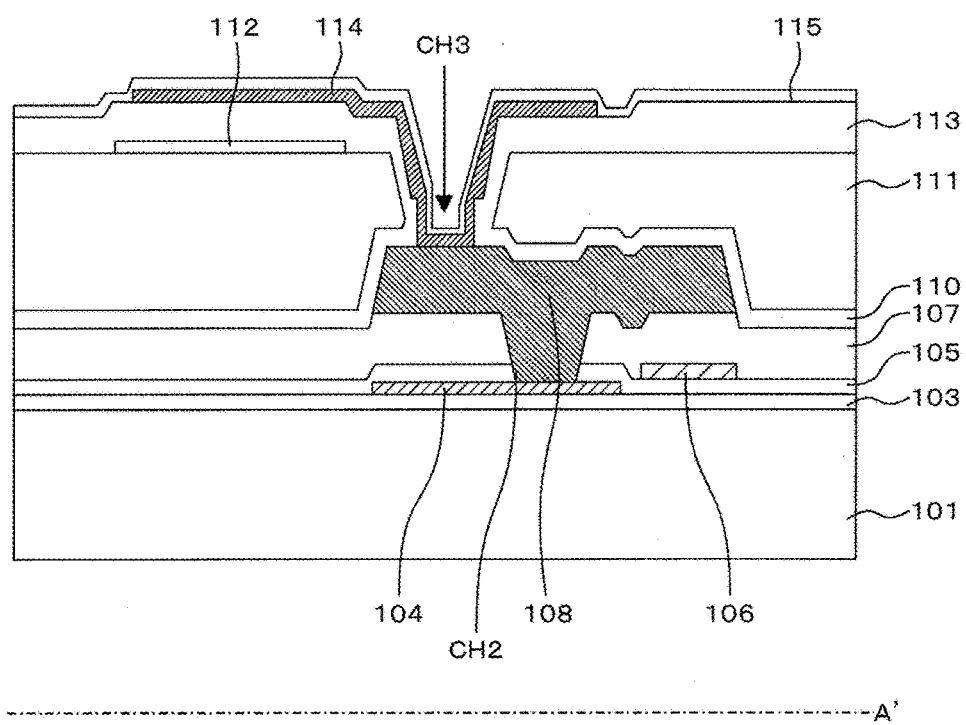
FIG. 6 is a cross-sectional view taken along the line A-A' of FIG. 5.
Figure 7:
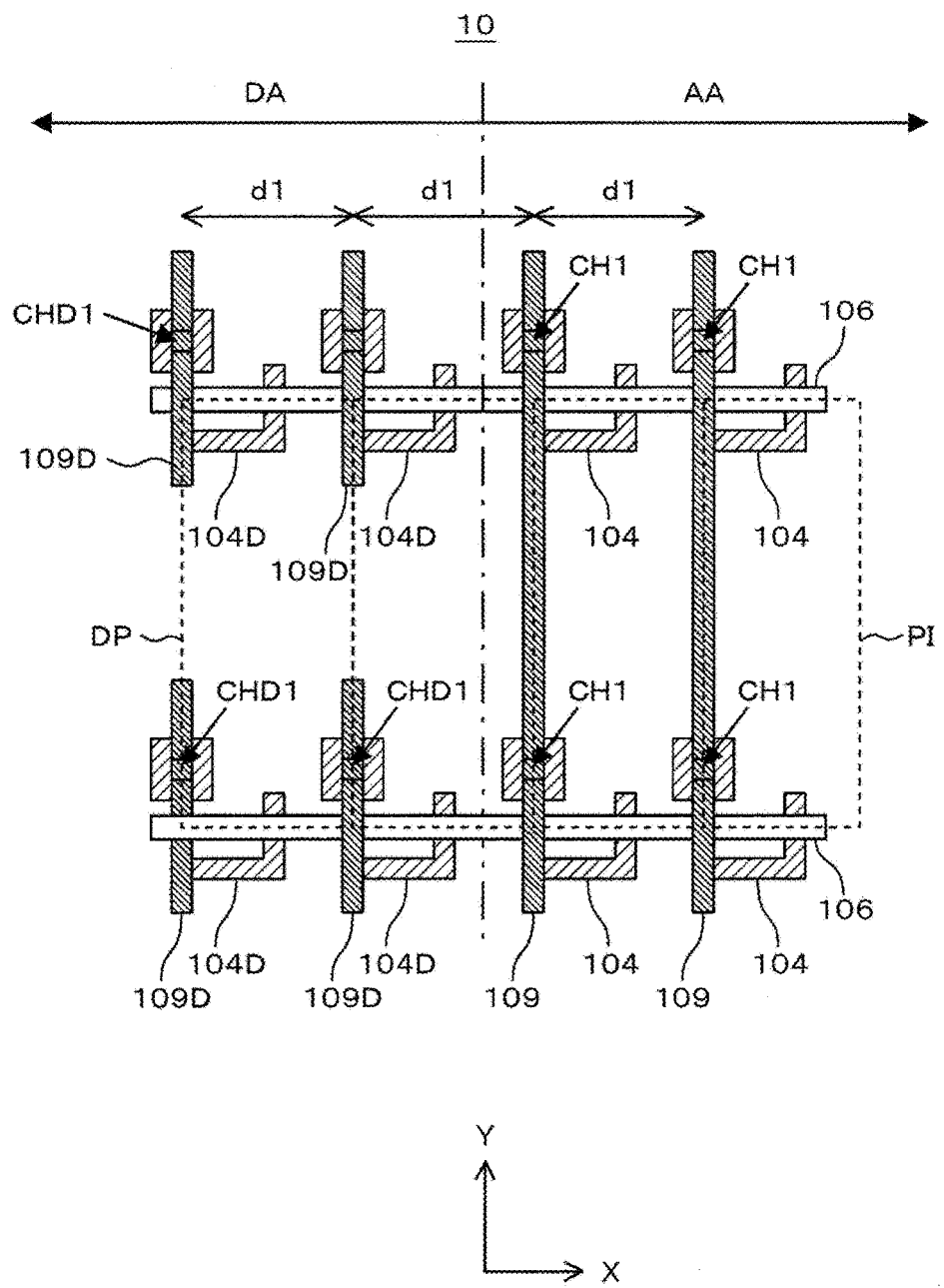
FIG. 7 is a top plan view for use in describing a display device according to the embodiment.

FIG. 1 is a top plan view for use in describing a display device according to the embodiment. FIG. 2 is a cross-sectional view taken along the line A-A' of FIG. 1. FIG. 3 is a top plan view for use in describing the portion of the dotted line B of FIG. 1. FIG. 4 is a top plan view for use in describing the portion of the dotted line C of FIG. 1. FIG. 5 is a top plan view for use in describing a pixel. FIG. 6 is a cross-sectional view taken along the line A-A' of FIG. 5. FIG. 7 is a top plan view for use in describing an array substrate according to the embodiment, showing a wiring pattern.

As illustrated in FIGS. 1 and 2, a display device 100 includes a display panel 1, a driver Integrated Circuit (IC) 2, a Flexible Printed Circuits (FPC) 3 for receiving image information from the outside in the driver IC 2, and a backlight 4. The display panel 1 is formed in that a liquid crystal 30 is sealed by a sealing material 40 between an array substrate 10 and an opposite substrate 20 and that polarizing plates 50 and 60 are respectively attached to the array substrate 10 and the opposite substrate 20. A dummy pixel area DA is arranged outside of the display area AA for displaying an image. The dummy pixel area DA is a part of a frame area provided in the periphery of the display area and the above mentioned sealing material is also provided in the frame area. Agate line scanning circuit is formed by the TFT in the both sides out of the above mentioned first dummy pixel area (outside of the dummy pixel area DA on the left and right sides in FIG. 1) of the dummy pixel area DA. The gate line scanning circuit may be included in the driver IC 2.

As illustrated in FIGS. 3 and 4, a plurality of pixels PI are arranged within the display area AA in a matrix shape. A plurality of dummy pixels DP are arranged in the dummy pixel area DA outside of the display area AA. The above mentioned gate line scanning circuit is arranged in adjacent to the left side of the dummy pixel area DA in FIG. 3. The above mentioned gate line scanning circuit is arranged in adjacent to the right side of the dummy pixel area DA in FIG. 4. A gate line 106 described later extends in the X direction and is connected to both the pixel PI and the dummy pixel DP arranged in the X direction. A plurality of gate lines 106 are arranged in the Y direction. A signal line 109 described later extends in the Y direction and is connected to the pixels PI in common arranged in the Y direction. A plurality of signal lines 109 are arranged in the X direction.

As illustrated in FIG. 5, the gate line 106 extending in the X direction and the signal line 109 extending in the Y direction form the pixel PI and the signal line 109 is connected to a pixel electrode 114 through a thin film transistor 116. One end of the semiconductor layer 104 is connected to the signal line 109 through a contact hole CH1 and the other end of the semiconductor layer 104 is connected to a metal electrode 108 through a contact hole CH2. The metal electrode 108 is connected to the pixel electrode 114. The pixel PI is rectangular with the length of the gate line 106 extending direction (X direction) shorter than the length of the signal line 109 extending direction (Y direction) but it is not restricted to this; it may be rectangular with the length of the gate line 106 extending direction (X direction) longer than the length of the signal line 109 extending direction (Y direction).

As illustrated in FIG. 6, the semiconductor layer 104 is arranged on the glass substrate 101 through an undercoat layer 103. The semiconductor layer 104 and the undercoat layer 103 are covered with a gate insulating layer 105. The gate line 106 is arranged on the gate insulating layer. The gate insulating layer 105 and the gate line 106 are covered with an interlayer insulating layer 107. The contact hole CH2 and the contact hole CH1 not illustrated in FIG. 6 are formed in the gate insulating layer 105 and the interlayer insulating layer 107, and a metal electrode 108 and the signal line 109 are formed on that. The metal electrode 108, the signal line 109 not illustrated in FIG. 6, and the interlayer insulating layer 107 are covered with a protective layer 110. An organic protective layer 111 is formed on the protective layer 110 to flatten the surface. The organic protective layer 111 is also referred to as a flatterning layer. A common electrode 112 is arranged on the organic protective layer 111. The common electrode 112 and the organic protective layer 111 are covered with the interlayer insulating layer 113. A contact hole CH3 is formed in the protective layer 110 on the metal electrode 108, the organic protective layer 111, and the interlayer insulating layer 113 and a pixel electrode 114 is formed on that. The pixel electrode 114 and the interlayer insulating layer 113 are covered with an alignment film 115. The semiconductor layer 104 is preferably formed of a low-temperature polysilicon film; however, it may be formed of an amorphous silicon film or the other semiconductor material. The gate line 106, the metal electrode 108, and the signal line 109 are formed of a metal film such as Al alloy. The common electrode 112 and the pixel electrode 114 are formed of an ITO film. The gate insulating layer 105, the interlayer insulating layer 107, the protective layer 110, and the interlayer insulating layer 113 are formed of a silicon oxide film or a silicon nitride film. In the example illustrated in FIG. 6, the pixel electrode 114 is to be connected to the signal line 109 through the thin film transistor when the gate line 106 becomes a High potential. A signal voltage transmitted by the signal line 109 is applied to the pixel electrode 114, to generate a potential difference between the common electrode 112 and itself.

The opposite substrate 20 includes a light shielding layer (black matrix) on the glass substrate, a color filter, an overcoat film, a spacer, and an alignment film. In the display device 100, the common electrode 112 is arranged on the array substrate 10 but it may be arranged between the overcoat film and the alignment film on the opposite substrate 20. Further, the light shielding layer (black matrix) and a color layer (color filter) may be arranged on the array substrate 10.

As illustrated in FIG. 7, the dummy pixel DP includes the gate line 106 extending also in the display area AA, a dummy semiconductor layer (second semiconductor layer) 104D, a dummy signal line 109D extending in the Y direction, and the contact hole CHD1 which connects the dummy signal line 109D and the semiconductor layer 104D. A pattern of the gate line 106, the dummy semiconductor layer 104D, and the contact hole CHD1 of connecting the dummy signal line 109D and the dummy semiconductor layer 104D in the dummy pixel DP is basically identical to that of the pixel PI. However, the dummy signal lines are separated from each other between the dummy pixels DP adjacent in the Y direction. Therefore, the dummy semiconductor layers 104D are electrically between the dummy pixels DP adjacent in the Y direction. The pixel PI includes the metal electrode 108 and the pixel electrode 114 illustrated in FIG. 5; however, they are omitted in FIG. 7.

The dummy pixel DP may be formed in the same structure as the pixel PI except that the dummy signal lines 109D are separated from each other, or may be formed without a part or all of the other components, not illustrated in FIG. 7, required for the pixel PI, that are, the metal electrode 108 and the pixel electrode. For example, the dummy pixel DP has the following structure. The semiconductor layer 104D is arranged on the glass substrate 101 through the undercoat layer 103. The semiconductor layer 104D and the undercoat layer 103 are covered with the gate insulating layer 105. The gate line 106 is arranged on the gate insulating layer 105. The gate insulating layer 105 and the gate line 106 are covered with the interlayer insulating layer 107. The contact hole CHD1 is formed in the gate insulating layer 105 and the interlayer insulating layer 107, and the dummy signal line 109D is formed on that. The dummy signal line 109D and the interlayer insulating layer 107 are covered with the protective layer 110. The organic protective layer 111 is formed on the protective layer 110 to flatten the surface. The organic protective layer 111 is covered with the interlayer insulating layer 113. The interlayer insulating layer 113 is covered with the alignment film 115. The semiconductor layer 104D is preferably formed of the same material in the same process as the semiconductor layer 104 of the pixel in the display area. Further, the semiconductor layer 104 in the display area and the semiconductor layer 104D in the dummy pixel can be formed in the same shape.

The interval (pitch) of the signal lines 109 in the display area AA is d1 and the pitch of the dummy signal lines 109D in the dummy pixel area DA is also d1. Further, the pitch between the signal line 109 and the dummy signal line 109D is also d1.

The dummy pixel DP can be formed substantially in the same shape as the pixel PI, hence to avoid the affect on the display caused by a change of the process or an electromagnetic change in the end portion of the display area. Further, the gate line 106 of the dummy pixel DP crosses the dummy semiconductor layer 104D, and therefore, static electricity generated in the manufacturing time can avoid the ESD damage of the thin film transistor in the display area. Further, the dummy signal lines are separated from each other between the dummy pixels DP adjacent in the Y direction; therefore, when ESD damage occurs between the gate line 106 and the dummy signal line 109D and between the gate line 106 and the dummy semiconductor layer 104D, the static electricity can be avoided from transmitting to the adjacent dummy pixel DP in the Y direction through the dummy signal line. Since the pitch (d1) of the dummy signal lines 109D is the same as the pitch (d1) of the signal lines 109, the dummy pixel area DA will be larger when the number of the dummy pixels DP is intended to increase in order to avoid the ESD damage.

Modified Example 1

A first modified example (hereinafter, referred to as a modified example 1) according to the embodiment will be described using FIGS. 8 to 10.

Figure 8:
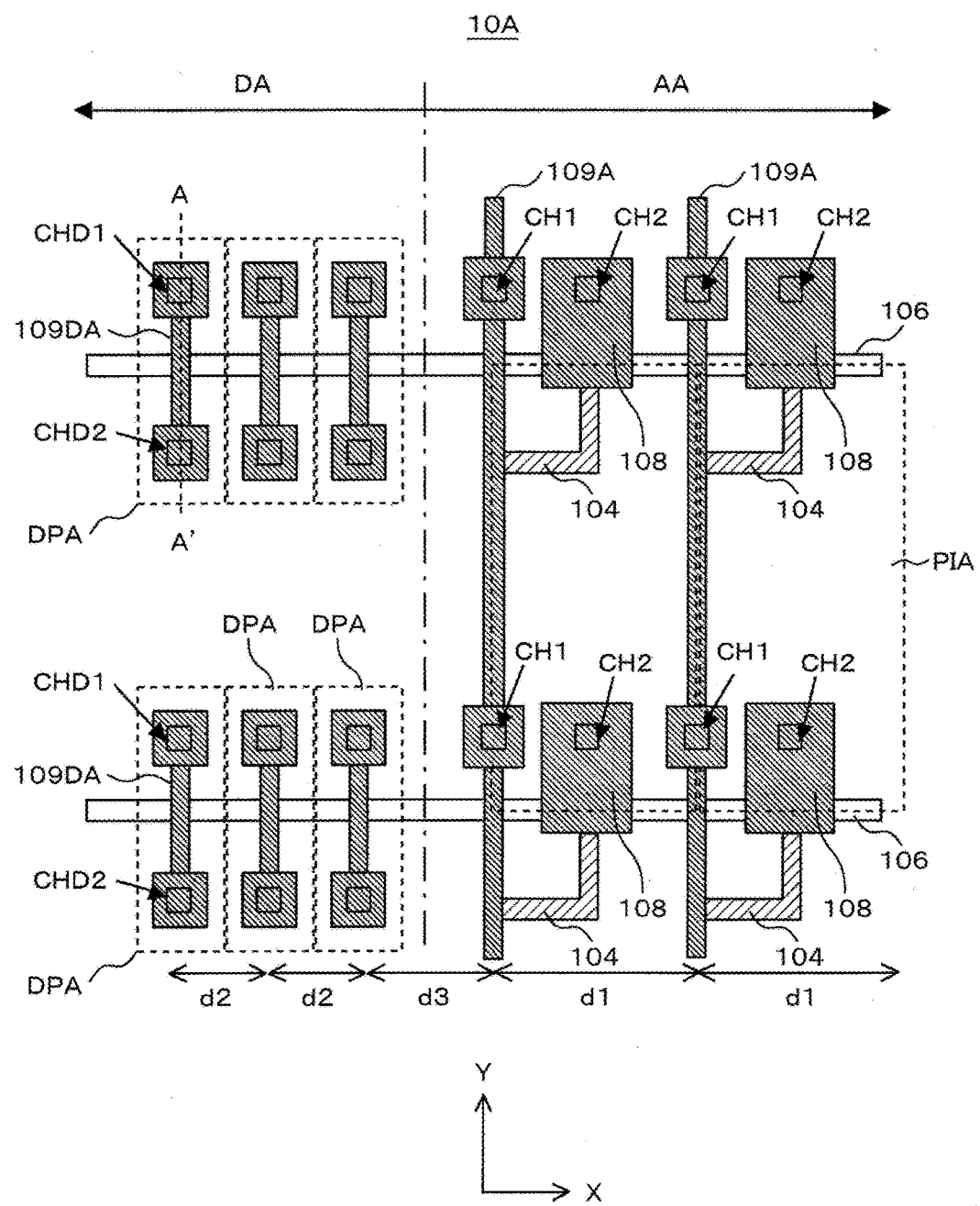
FIG. 8 is a top plan view for use in describing a display device according to a modified example 1.
Figure 9:
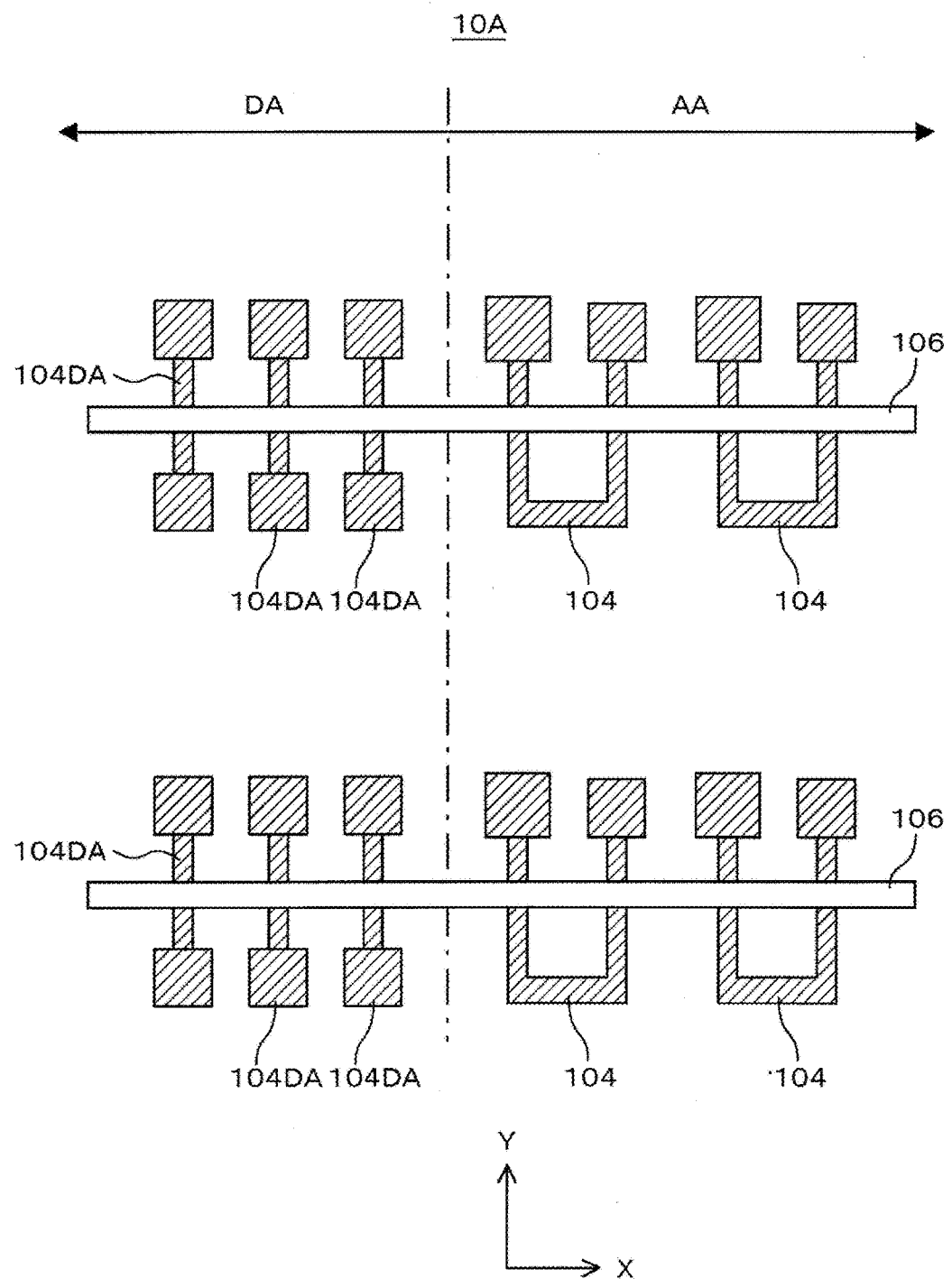
FIG. 9 is a top plan view for use in describing the display device according to the modified example 1.

FIGS. 8 and 9 are top plan views for use in describing an array substrate according to the modified example 1, showing a wiring pattern. FIG. 9 is a top plan view with the pattern of the signal lines and the contact holes eliminated from the view of FIG. 8. FIG. 10 is a cross-sectional view taken along the line A-A' of FIG. 8.

A display device according to the modified example 1 uses an array substrate 10A described later, instead of the array substrate 10 of the display device 100 according to the embodiment. The array substrate 10A according to the modified example 1 includes a display area (first area) AA for displaying images and a dummy pixel area (second area) DA outside of the display area AA, similarly to the array substrate 10.

The display area AA includes a plurality of pixels (first pixel, third pixel) PIA. The pixel PIA is different from the pixel PI in that the width of the signal line around the contact holes CH1 and CH2 is larger similarly to the semiconductor layer 104; however, except for the above, the pixel PIA is basically the same as the pixel PI. The pixel PIA includes the gate line (first gate line, third gate line) 106 extending in the X direction (first direction), the semiconductor layer (first semiconductor layer, third semiconductor layer) 104, and the signal line (first signal line, third signal line) 109A extending in the Y direction (second direction). Further, the pixel PIA includes the contact hole CH1 for connecting the signal line 109A to the semiconductor layer 104, the metal electrode 108, and the contact hole CH2 for connecting the metal electrode 108 to the semiconductor layer 104. Although the pixel PIA includes the pixel electrode 114 to be connected to the metal electrode 108, it is omitted here. The semiconductor layer 104 forms a part of the TFT, the source of the TFT is connected to the pixel electrode 114 through the metal electrode 108, and the drain of the TFT is connected to the signal line 109A.

The dummy pixel area DA includes a plurality of dummy pixels (second pixel, fourth pixel) DPA. The dummy pixel DPA includes the gate line (second gate line, fourth gate line) 106 extending also in the display area AA, the dummy semiconductor layer (second semiconductor layer, fourth semiconductor layer) 104DA, the dummy signal line (second signal line, fourth signal line) 109DA extending also in the Y direction, and the contact holes (first contact hole and second contact hole) CHD1 and CHD2 for connecting the dummy signal line 109DA to the dummy semiconductor layer 104DA. The dummy semiconductor layer 104DA is arranged under the dummy signal line 109DA, extending in a way of being covered with the dummy signal line 109DA, and connected to the dummy signal line 109DA at the two positions of the contact holes CHD1 and CHD2. It is preferable that the dummy semiconductor layer 104DA is completely covered with the dummy signal line 109DA; however, it may not be completely covered but some part of the above layer may be overlapped with the line and other part of the layer may be extruded from the line. The width of the dummy signal line around the contact holes CHD1 and CHD2 is formed as large as the width of the semiconductor layer 104DA. The dummy signal lines 109DA of the dummy pixels DPA adjacent in the X direction and the dummy signal lines 109DA of the dummy pixels DPA adjacent in the Y direction are respectively separated from each other. Therefore, the dummy semiconductor layers 104DA of the dummy pixels DPA adjacent in the Y direction are electrically separated from each other. The dummy pixel DPA does not include the metal electrode 108 and the pixel electrode 114 connected to the metal electrode 108 which are included in the pixel PIA. The interval (pitch) of the signal lines 109A in the display area AA is d1, and the pitch of the dummy signal lines 109DA or the dummy semiconductor layers 104DA in the dummy pixel area DA is d2(<d1). The pitch (d3) between the signal line 109A and the dummy signal line 109DA may be identical to d1 or d2; alternatively, it may be different from any of d1 and d2.

Figure 10:
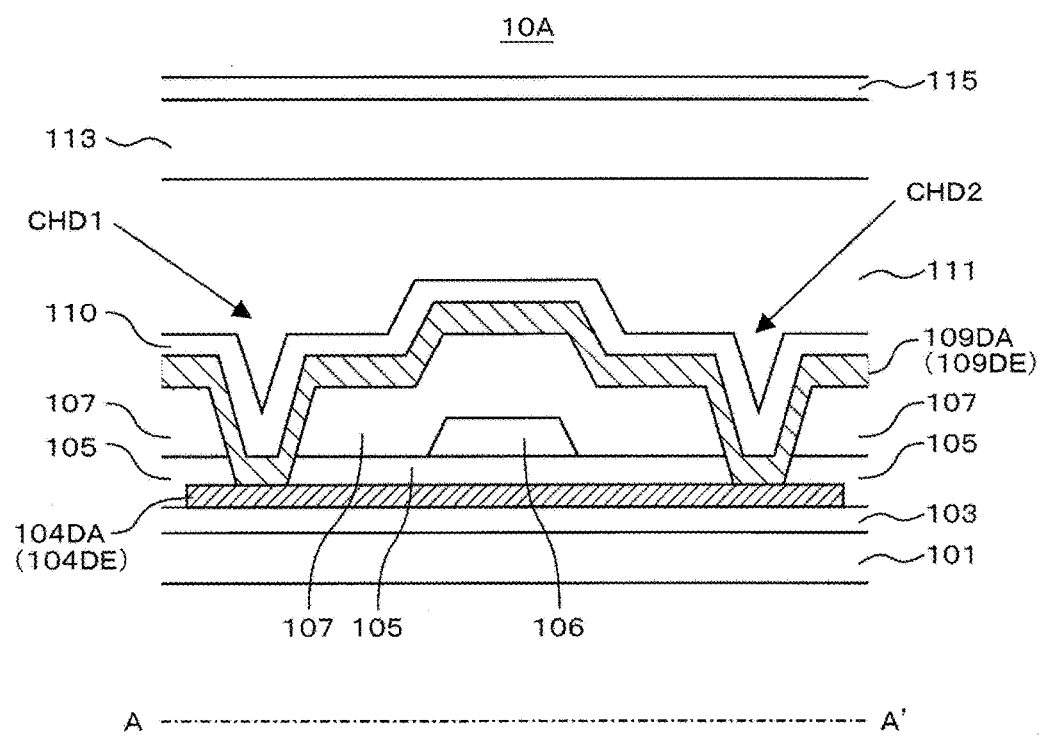
FIG. 10 is a cross-sectional view taken along the line A-A' of FIG. 8.

As illustrated in FIG. 10, the dummy semiconductor layer 104DA is arranged on the glass substrate 101 through the undercoat film 103. The gate line 106 formed of a metal layer is arranged on the dummy semiconductor layer 104DA through the gate insulating layer (first insulating layer) 105. The dummy signal line 109DA formed of a metal layer is arranged on the gate line 106 through the interlayer insulating layer (second insulating layer) 107. The dummy semiconductor layer 104DA is connected to the dummy signal line 109DA through the contact holes CHD1 and CHD2 bored in the gate insulating layer 105 and the interlayer insulating layer 107. The dummy signal line 109DA is covered with the protective layer 110 and further covered with the organic protective layer 111. The organic protective layer 111 is covered with the interlayer insulating layer 113 and the interlayer insulating layer 113 is covered with the alignment film 115. It is preferable that the dummy semiconductor layer 104DA is made of the same material as the semiconductor layer of the TFT included in the pixel in the display area. The dummy signal line 109DA is preferably formed with the same width in the same layer as the signal line 109A in the display area AA; however, it is not restricted to this. The semiconductor layer 104DA is preferably formed in the same layer as the semiconductor layer 104 in the display area AA and the width (channel width) of a portion (intersection) crossing the gate line 106 is preferably the same as the channel width of the semiconductor layer 104; however, they are not restricted to these.

The gate line 106 of the dummy pixel DPA crosses the dummy semiconductor layer 104DA and therefore, ESD damage of the TFT in the display area caused by the static electricity generated in the manufacturing time can be reduced. The dummy signal lines are separated from each other between the dummy pixels DPA adjacent in the Y direction and therefore, when the ESD damage occurs between the gate line 106 and the dummy signal line 109DA and between the gate line 106 and the dummy semiconductor layer 104DA, a short circuit between the dummy signal lines 109DA and the semiconductor layers 104DA of the dummy pixels DPA adjacent in the Y direction and the gate lines 106 can be avoided.

The pitch (d2) of the dummy signal lines 109DA on the array substrate 10A can be smaller than the pitch (d1) of the dummy signal lines 109D in the array substrate 10, and therefore, the space of the dummy pixel area DA can be reduced. The dummy pixel DPA is not formed only of the dummy semiconductor layer 104DA but the dummy semiconductor layer 104DA is covered with the dummy signal line 109DA of a metal layer with the contact hole formed in the gate insulating layer 105 and the interlayer insulating layer 107. Here, the dummy signal line may be formed to be connected to the semiconductor layer 104DA through one contact hole not two contact holes. Further, although this is in common with the other examples, the pitch (d2) of the dummy signal lines 109DA or the dummy semiconductor layers 104DA in the dummy pixel area does not have to be even. According to the frequency of generation of the static electricity, the pitch on the side of the display area can be increased and the pitch on the side distant from the display area can be decreased, and vice versa. Alternatively, the same pitch is applied to all the gate lines but the pitch may be various among the adjacent gate lines. According to this, even when the number of the dummy pixels is the same, the gate line with a narrow width of the dummy pixel area or the gate line with a larger number of the dummy pixels with the same width of the dummy pixel area becomes possible.

Modified Example 2

A second modified example (a modified example of the modified example 1 and hereinafter, referred to as a modified example 2) of the embodiment will be described using FIGS. 11 and 12.

Figure 11:
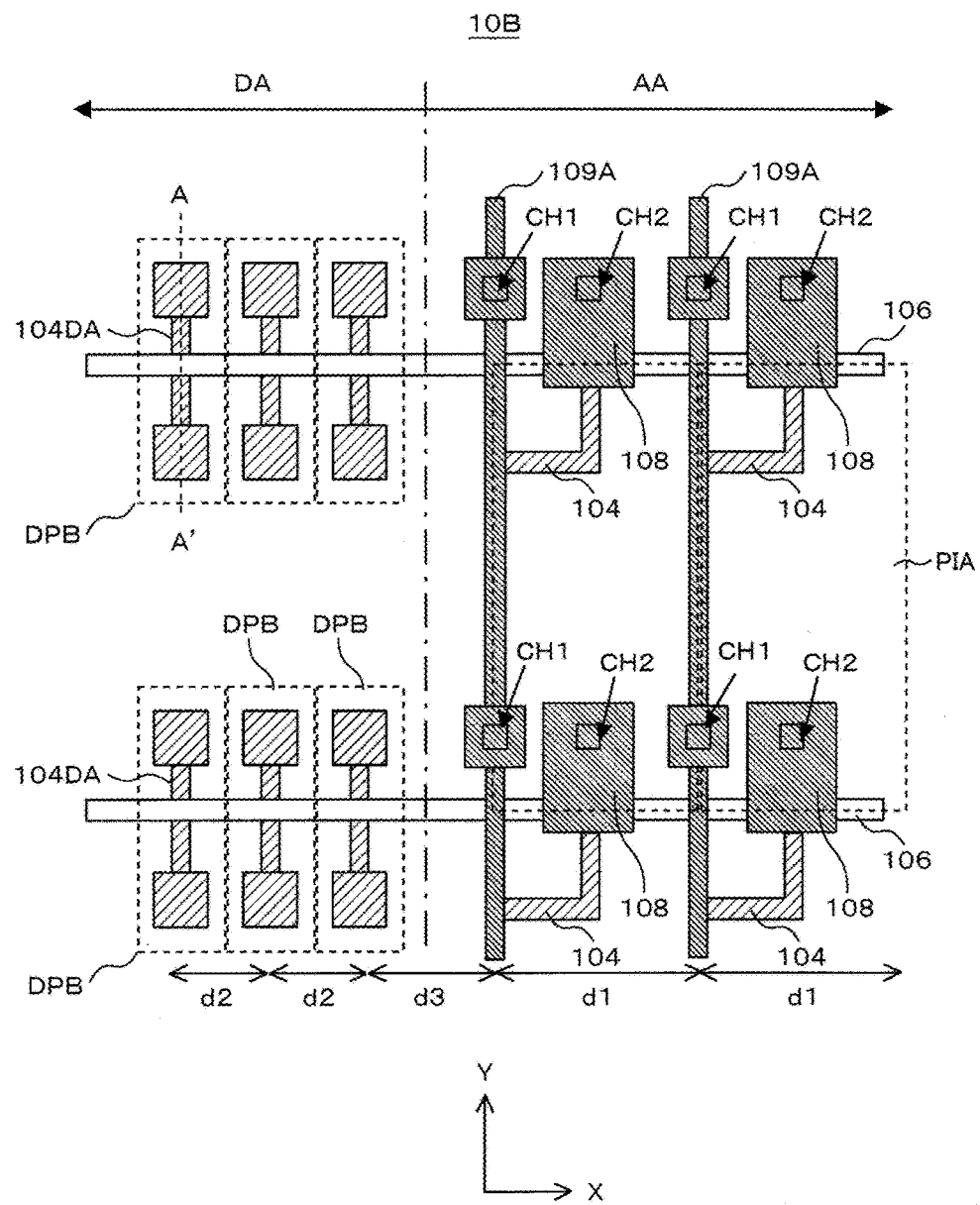
FIG. 11 is a top plan view for use in describing a display device according to a modified example 2.
Figure 12:
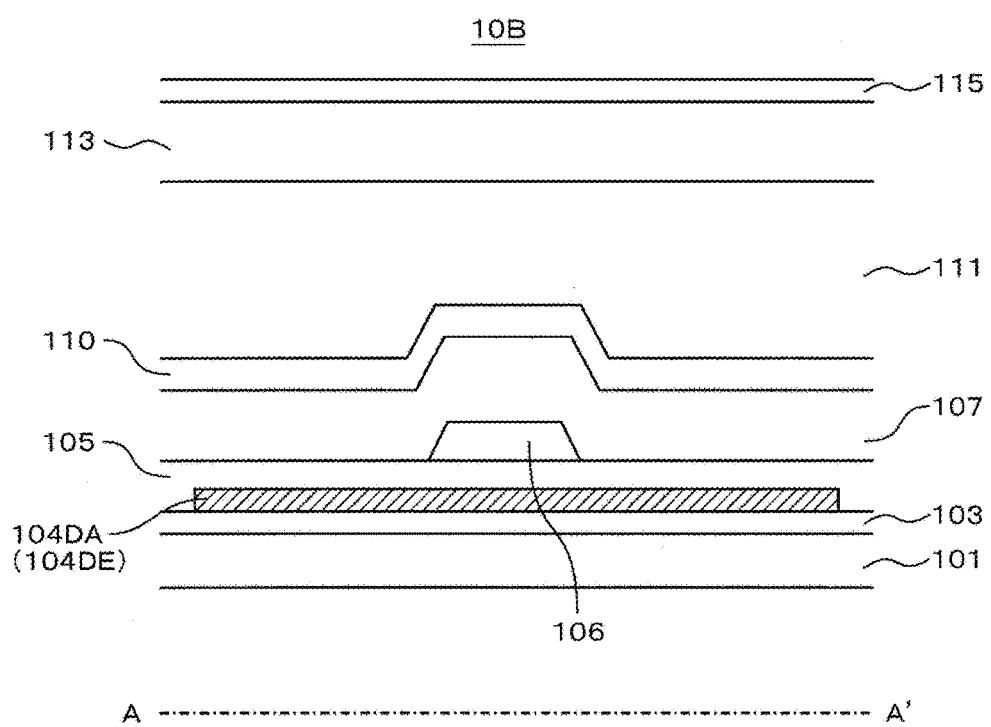
FIG. 12 is a cross-sectional view taken along the line A-A' of FIG. 11.

FIG. 11 is a top plan view for use in describing an array substrate according to the modified example 2, showing a wiring pattern. FIG. 12 is a cross-sectional view taken along the line A-A' of FIG. 11.

A display device according to the modified example 2 uses an array substrate 10B described later, instead of the array substrate 10 of the display device 100 according to the embodiment. In the dummy pixel DPA on the array substrate 10A according to the modified example 1, the dummy semiconductor layer 104DA is arranged under the dummy signal line 109DA, extending in a way of being covered with the dummy signal line 109DA, and connected to the dummy signal line 109DA at the two positions of the contact holes CHD1 and CHD2. On the other hand, as illustrated in FIGS. 11 and 12, the dummy pixel DPB on the array substrate 10B according to the modified example 2 does not have the dummy signal line 109DA and the contact holes CHD1 and CHD2. Except for this point, the array substrate 10B according to the modified example 2 is basically identical to the array substrate 10A according to the modified example 1. The dummy semiconductor layer 104DA has no conductive layer to be connected and the dummy semiconductor layers 104DA of the dummy pixels DPB adjacent in the Y direction are electrically separated from each other. The interval (pitch) of the signal lines 109A in the display area AA is d1 and the pitch of the dummy semiconductor layers 104DA in the dummy pixel area DA is d2(<d1). Further, the pitch (d3) between the signal line 109A and the dummy semiconductor layer 104DA may be identical to d1 or d2; alternatively, it may be different from d1 and d2.

The gate line 106 of the dummy pixel DPB crosses the dummy semiconductor layer 104DA, and therefore, according to the static electricity generated before forming the signal line 109A, ESD damage between the gate line and the semiconductor of the pixel in the display area can be reduced. The dummy semiconductor layers 104DA are electrically separated from each other between the dummy pixels DPA, and therefore, when the ESD damage occurs between the gate line 106 and the dummy semiconductor layer 104DA, the static electricity can be prevented from transmitting to the semiconductors of the adjacent dummy pixel and pixel. Since there is no metal layer to be connected to the semiconductor layer, there is no need to form a contact hole. Therefore, there is no need to widen the width of the end portion of the semiconductor layer but the width of the semiconductor layer can be extended with the same width of the intersection portion with the gate line as it is.

Modified Example 3

A third modified example (the modified example of the modified example 1 and hereinafter, referred to as a modified example 3) of the embodiment will be described using FIGS. 13 to 15.

Figure 13:
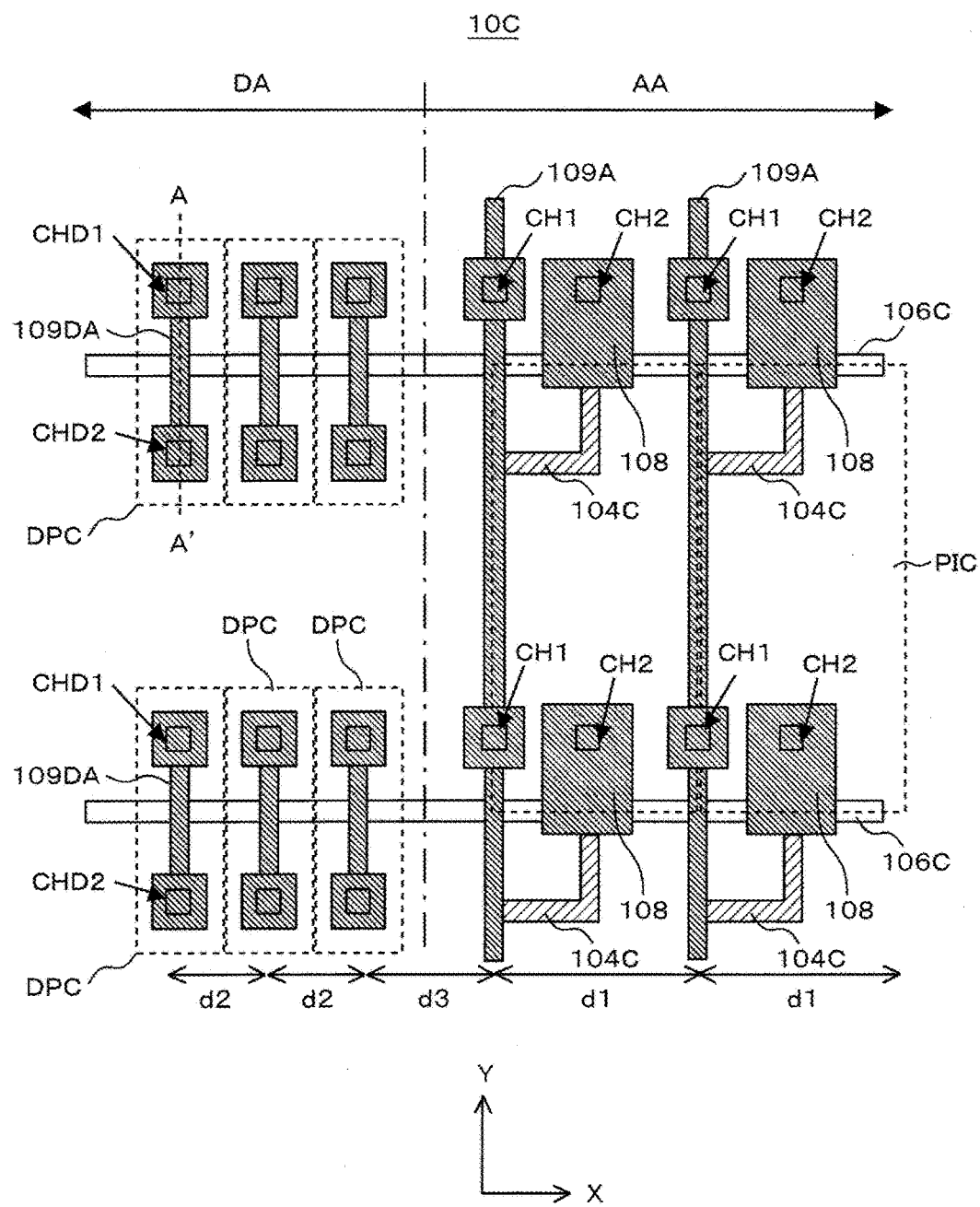
FIG. 13 is a top plan view for use in describing a display device according to a modified example 3.
Figure 14:
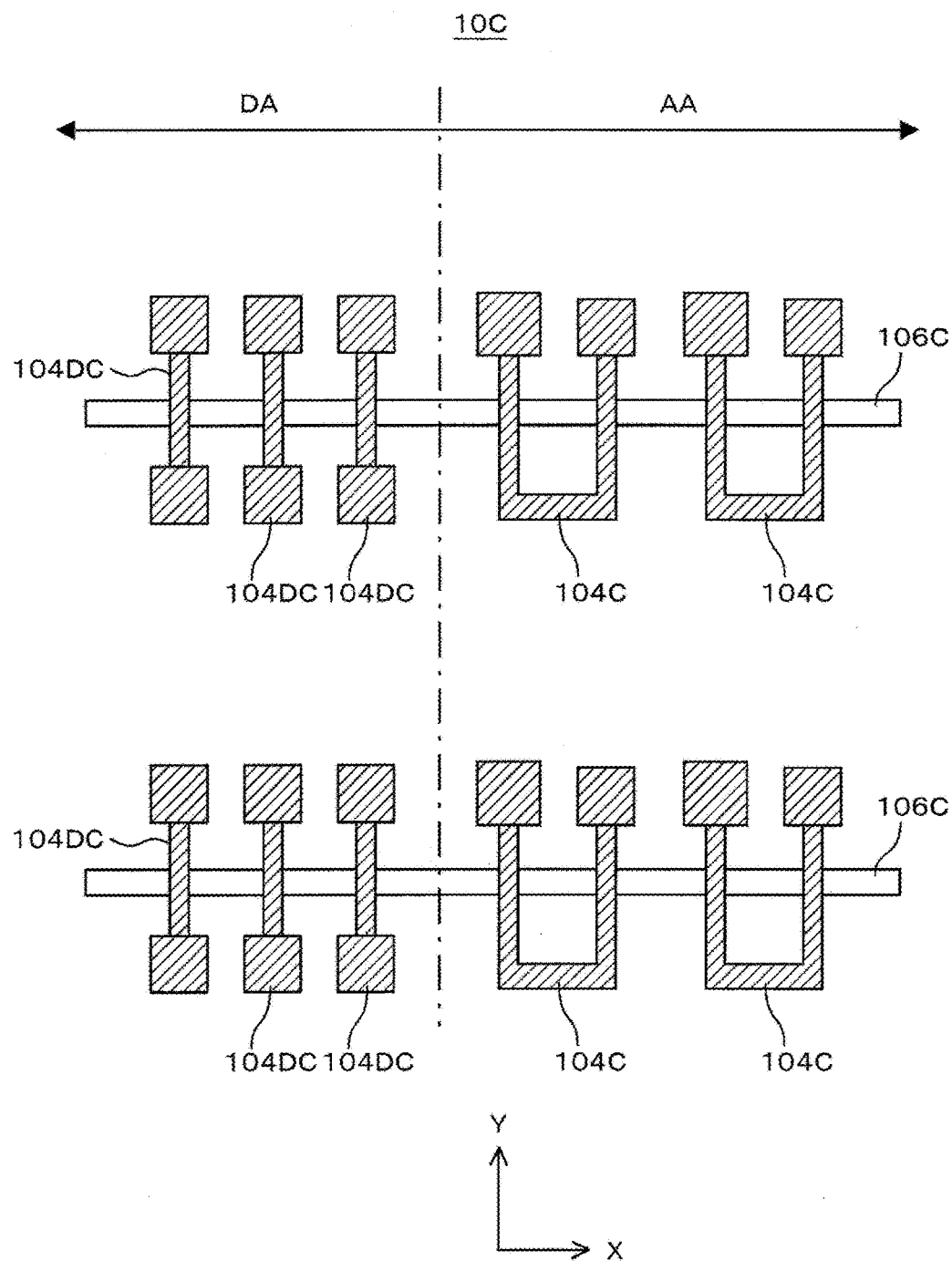
FIG. 14 is a top plan view for use in describing the display device according to the modified example 3.
Figure 15:
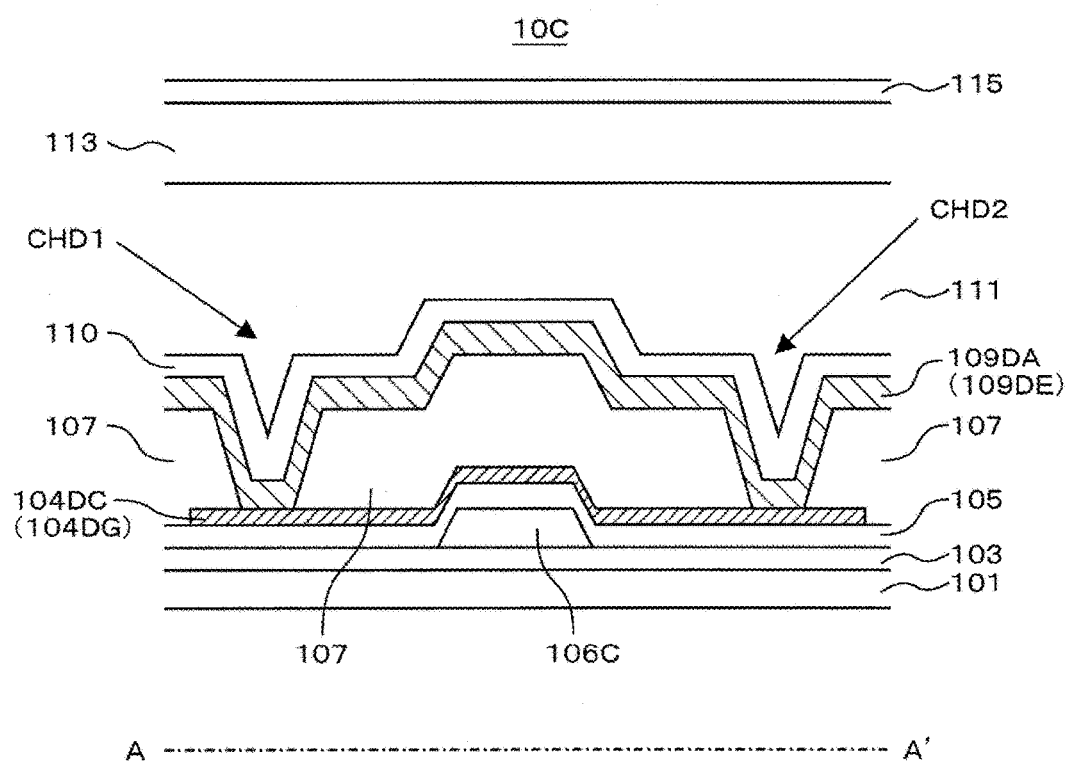
FIG. 15 is a cross-sectional view taken along the line A-A' of FIG. 13.

FIGS. 13 and 14 are top plan views for use in describing an array substrate according to the modified example 3, showing a wiring pattern. FIG. 14 is a top plan view with the pattern of the signal lines and the contact holes eliminated from the view of FIG. 13 FIG. 15 is a cross-sectional view taken along the line A-A' of FIG. 13.

A display device according to the modified example 3 uses an array substrate 10C described later, instead of the substrate 10 of the display device 100 according to the embodiment. In the pixel PIA and the dummy pixel DPA on the array substrate 10A according to the modified example 1, the gate line 106 is formed on each of the semiconductor layers 104 and 104DA through the gate insulating layer 105. On the other hand, as illustrated in FIGS. 14 and 15, in the pixel (first pixel, third pixel) PIC on the array substrate 10C according to the modified example 3, the semiconductor layer (first semiconductor layer, third semiconductor layer) 104C is formed on the gate line (first gate line, third gate line) 106C through the gate insulating layer 105. In the dummy pixel (second pixel, fourth pixel) DPC, the semiconductor layer (second semiconductor layer, fourth semiconductor layer) 104DC is formed on the gate line (second gate line, fourth gate line) 106C through the gate insulating film 105. Therefore, the contact holes CH1, CH2, CHD1, and CHD2 are formed in the interlayer insulating layer 107. Except for this, the array substrate 10C according to the modified example 3 is basically identical to the array substrate 10A according to the modified example 1.

The dummy pixel DPC is not formed only by the dummy semiconductor layer 104DC but the dummy semiconductor layer 104DC is covered with the dummy signal line 109DA of a metal layer with the contact hole formed in the interlayer insulating layer 107. The metal layer may not be formed on the interlayer insulating film but may be directly formed on the semiconductor layer. In this case, there is no need to forma contact hole, and therefore, the width of the end portion of the semiconductor layer and the metal layer does not have to be widened. The width of the semiconductor layer and the metal layer can be extended with the same width of the intersection portion with the gate line as it is.

Modified Example 4

A fourth modified example (the modified example of the modified example 3 and hereinafter, referred to as a modified example 4) of the embodiment will be described using FIGS. 16 and 17.

Figure 16:
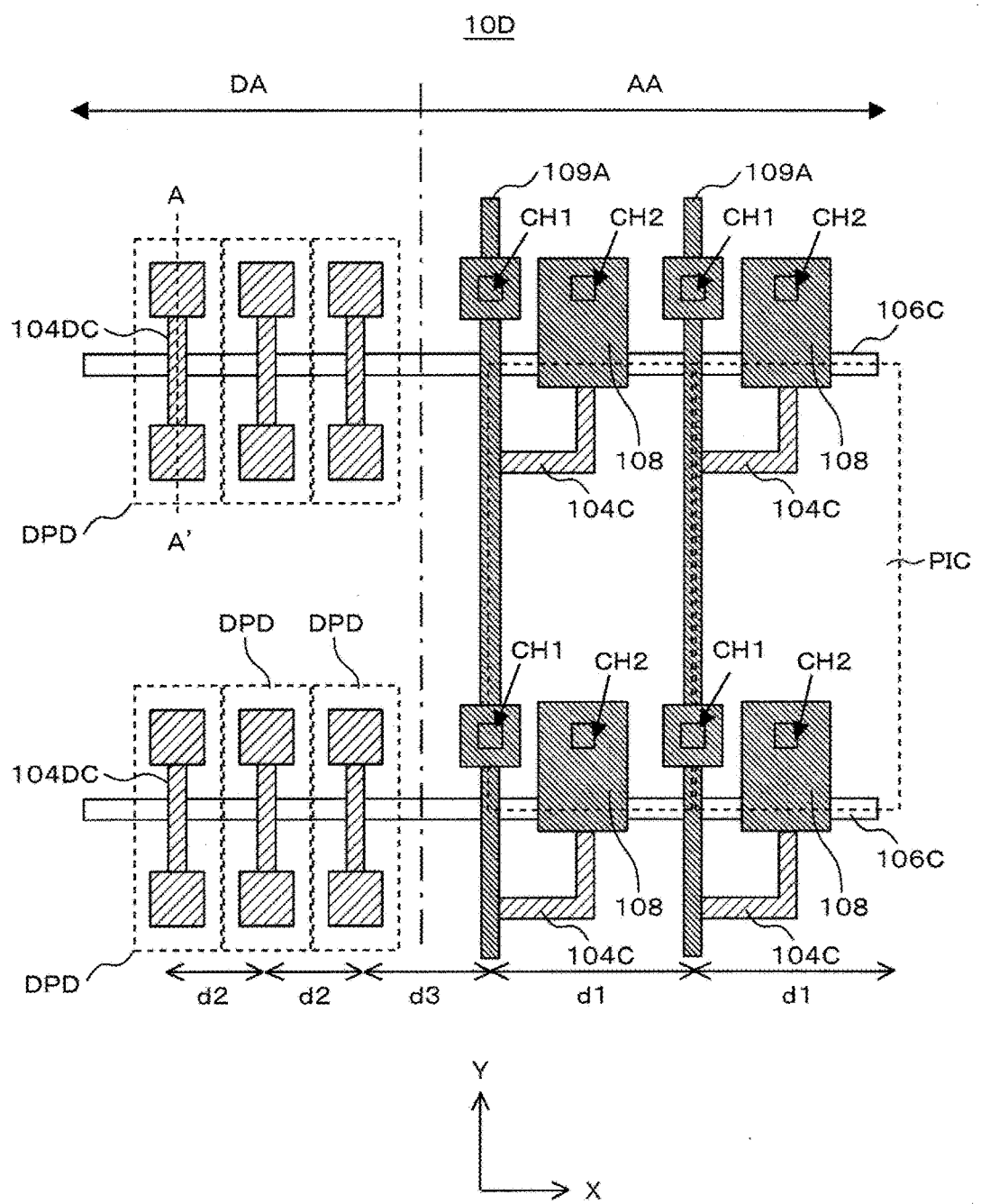
FIG. 16 is a top plan view for use in describing a display device according to a modified example 4.
Figure 17:
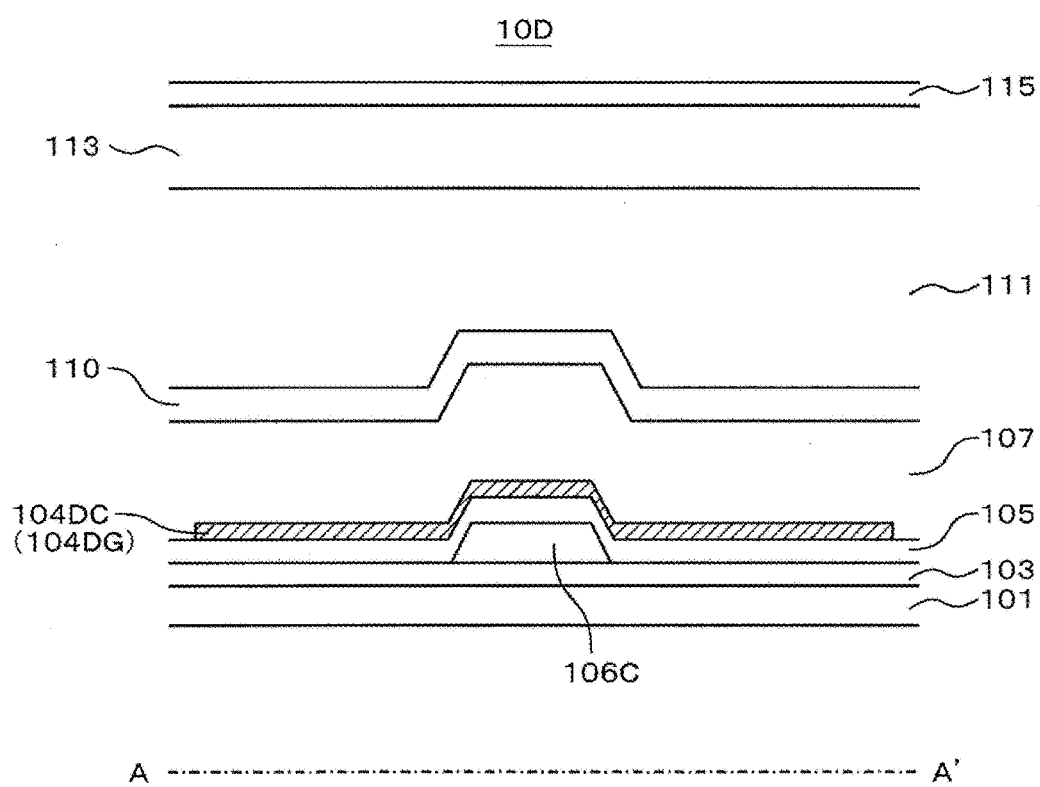
FIG. 17 is a cross-sectional view taken along the line A-A' of FIG. 16.

FIG. 16 is a top plan view for use in describing an array substrate according to the modified example 4, showing a wiring pattern. FIG. 17 is a cross-sectional view taken along the line A-A' of FIG. 16.

A display device according to the modified example 4 uses an array substrate 10D described later, instead of the substrate 10 of the display device 100 according to the embodiment. In the dummy pixel DPC on the array substrate 10C according to the modified example 3, the dummy semiconductor layer 104DC is arranged under the dummy signal line 109DA, extending in a way of being covered with the dummy signal line 109DA, and connected to the dummy signal line 109DA at the two positions of the contact holes CHD1 and CHD2. On the other hand, as illustrated in FIGS. 16 and 17, the dummy pixel DPD on the array substrate 10D according to the modified example 4 does not have the dummy signal line 109DA and the contact holes CHD1 and CHD2. Except for this, the array substrate 10D according to the modified example 4 is basically identical to the array substrate 10C according to the modified example 3. The dummy semiconductor layer 104DC has no conductive layer to be connected and the dummy semiconductor layers 104DC are separated from each other between the dummy pixels DPD adjacent in the Y direction. The interval (pitch) of the signal lines 109A in the display area AA is d1 and the pitch of the dummy semiconductor layers 104DC in the dummy pixel area DA is d2(<d1). The pitch (d3) between the signal line 109A and the dummy semiconductor layer 104DC may be identical to d1 or d2; alternatively, it may be different from d1 and d2.

Also in this case, there is no need to forma contact hole; accordingly there is no need to widen the width of the end portion of the semiconductor layer but the width of the semiconductor layer can be extended with the same width of the intersection portion with the gate line as it is.

Modified Example 5

A fifth modified example (the modified example of the modified example 1 and hereinafter, referred to as a modified example 5) of the embodiment will be described using FIGS. 18 and 19.

Figure 18:
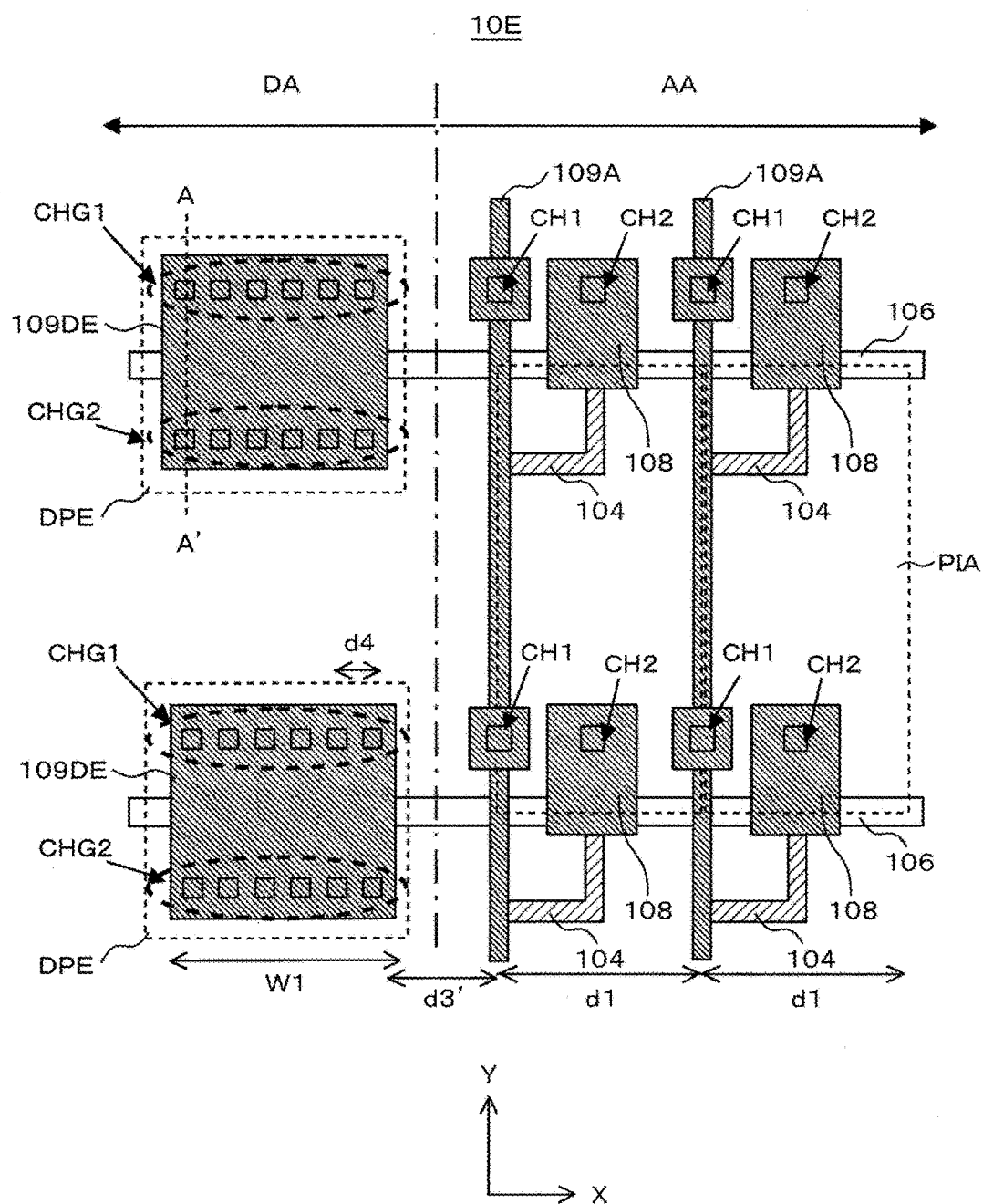
FIG. 18 is a top plan view for use in describing a display device according to a modified example 5.
Figure 19:
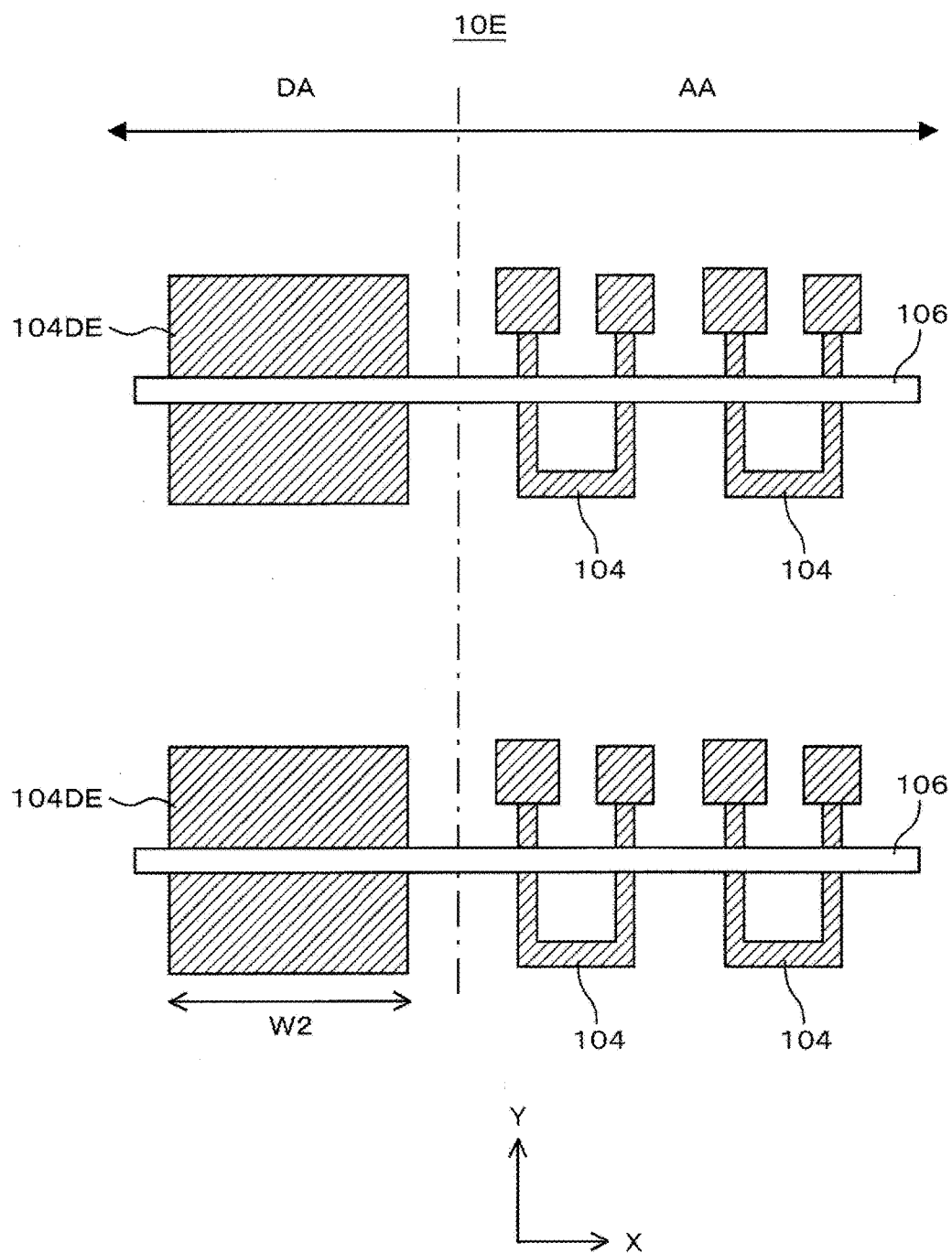
FIG. 19 is a top plan view for use in describing the display device according to the modified example 5.

FIGS. 18 and 19 are top plan views for use in describing an array substrate according to the modified example 5, showing a wiring pattern. FIG. 19 is a top plan view with the pattern of the signal lines and the contact holes eliminated from the view of FIG. 18

A display device according to the modified example 5 uses an array substrate 10E described later, instead of the substrate 10 of the display device 100 according to the embodiment. The array substrate 10E according to the modified example 5 includes the display area AA for displaying images and the dummy pixel area DA outside of the display area AA. The dummy pixel area DA illustrated in FIGS. 18 and 19 is the above mentioned first dummy pixel area. The display area AA includes a plurality of pixels PIA similarly to the array substrate 10A according to the modified example 1.

The dummy pixel area DA includes a plurality of dummy pixels (second pixel, fourth pixel) DPE. The dummy pixel DPE includes the gate line 106 extending also in the display area AA, the dummy semiconductor layer (second semiconductor layer, fourth semiconductor layer) 104DE, the dummy signal line (second signal line, fourth signal line) 109DE, and contact hole groups (first contact hole, second contact hole) of CHG1 and CHG2 for respectively connecting the dummy signal lines 109DE to the dummy semiconductor layers 104DE. The dummy semiconductor layer 104DE is arranged under the dummy signal line 109DE, extending in a way of being covered with the dummy signal line 109DE, and connected to the dummy signal line 109DE at the two positions of the contact hole groups of CHG1 and CHG2. Although it is preferable that the dummy semiconductor layer 104DE is completely covered with the dummy signal line 109DE in plan view, the dummy semiconductor layer 104DE does not have to be completely covered with the dummy signal line 109DE but a part of the layer may be extruded. The interval (d4) of each contact hole in the contact hole groups of CHG1 and CHG2 is smaller than the pitch (d2) of the dummy signal lines 109DA on the array substrate 10A according to the modified example 1. Similarly to the embodiment, the modified example 1, and the modified example 3, the dummy signal lines 109DE are separated from each other between the dummy pixels DPE adjacent in the Y direction. Therefore, the dummy semiconductor layers 104DE are electrically separated from each other between the dummy pixels DPE adjacent in the Y direction. The dummy pixel DPE does not have the metal electrode 108 included in the pixel PIA and the pixel electrode 114 connected to the metal electrode 108. The interval (pitch) of the signal lines 109A in the display area AA is d1. The interval (d3') between the signal line 109A and the dummy signal line 109DE is a distance from the center line of the signal line 109A to the right end of the dummy signal line 109DE and may be identical to d1 or d2; alternatively, it may be different from d1 and d2. Here, the cross-sectional view taken along the line A-A' of FIG. 18 is identical to FIG. 15.

The width (W1) of the dummy signal line 109DE in the dummy pixel area DA and the width (W2) of the dummy semiconductor layer 104DE are larger than that in the embodiment, and the modified examples 1 to 4. Here, it is preferable that W1≥W2; however, it is not restricted to this. For example, when the dummy pixel area DA is so wide as to include the three dummy pixels DPA as illustrated in FIG. 8, the width (W2) of the dummy semiconductor layer 104DE can be twice or three times of the pitch (d2) of the dummy signal lines 109DA. The number of the contact holes is twice, that is six. Alternatively, the width (W2) of the dummy semiconductor layer 104DE is the same or larger than the pitch (d1) of the signal lines 109A. The area of the dummy semiconductor layer 104DE is increased to widen the channel width of the dummy semiconductor layer 104DE of the dummy pixel DPE more than the channel width of the semiconductor layer 104 of the pixel PIA. By increasing the intersection area of the dummy semiconductor layer and the gate line 106, a countermeasure against the ESD can be taken while reducing the layout space. Here, the width (W2) of the dummy semiconductor layer does not have to be identical all over the gate lines but the width of the dummy semiconductor layer may be formed variously in every gate line according to the frequency of generation of the static electricity. Further, it is possible to apply the modified examples 1 to 4 to some gate lines and apply this modified example to other gate lines. Further, a combination of the modified examples 1 to 4 and this modified example can be used for the same gate line. It is the same also in the following modified example.

Modified Example 6

A sixth modified example (the modified example of the modified example 5 and hereinafter, referred to as a modified example 6) of the embodiment will be described using FIG. 20.

Figure 20:
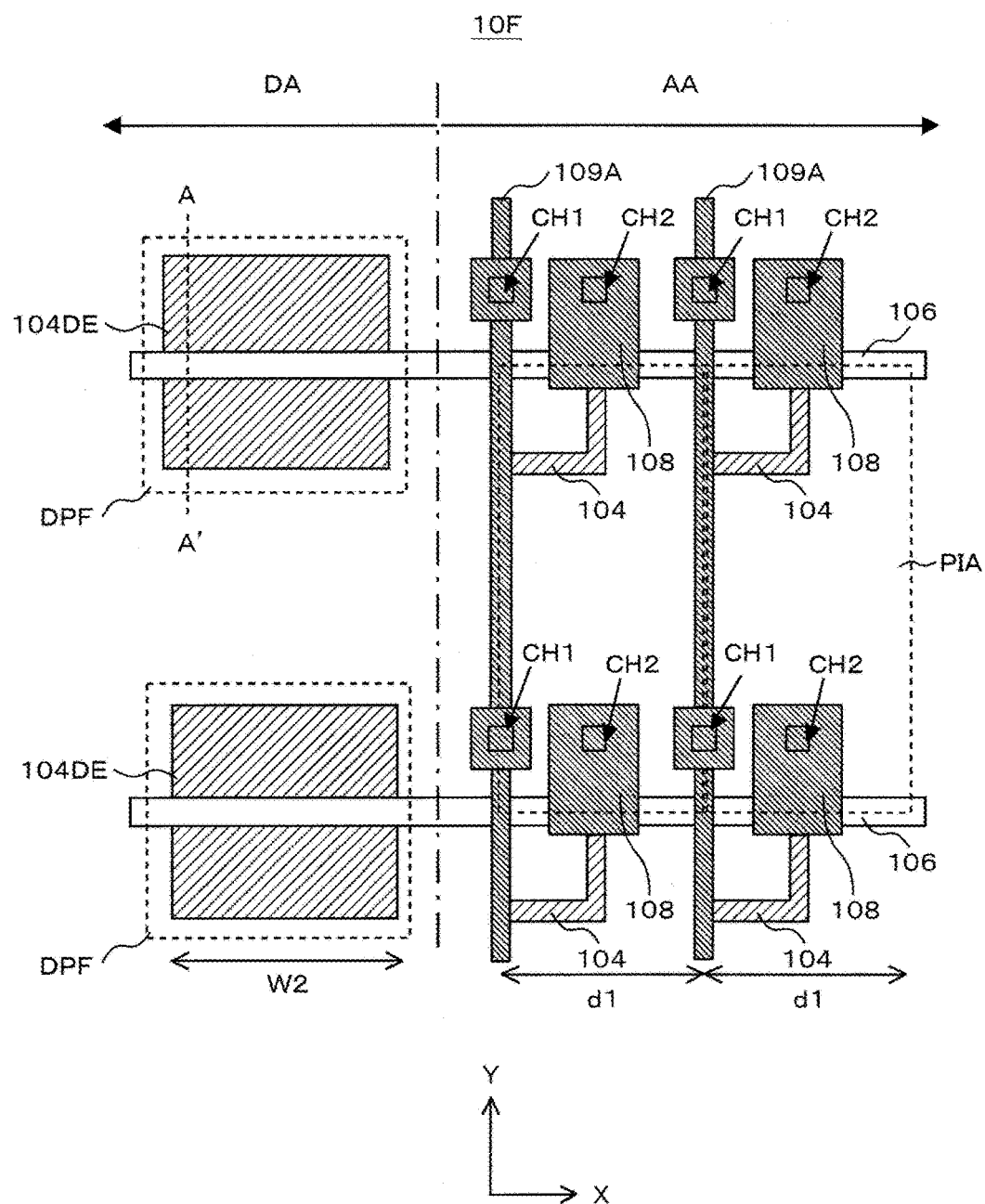
FIG. 20 is a top plan view for use in describing a display device according to a modified example 6.

FIG. 20 is a top plan view for use in describing an array substrate according to the modified example 6, showing a wiring pattern.

A display device according to the modified example 6 uses an array substrate 10F described later, instead of the substrate 10 of the display device 100 according to the embodiment. In the dummy pixel DPE on the array substrate 10E according to the modified example 5, the dummy semiconductor layer 104DE is arranged under the dummy signal line 109DE, in a way of being covered with the dummy signal line 109DE, and connected to the dummy signal line 109DE at the two positions of the contact hole groups of CHG1 and CHG2. On the other hand, as illustrated in FIG. 20, the dummy pixel DPF on the array substrate 10F according to the modified example 6 does not include the dummy signal line 109DE and the contact hole groups of CHG1 and CHG2. Except for this, the array substrate 10F according to the modified example 6 is basically identical to the array substrate 10E according to the modified example 5. The dummy semiconductor layer 104DE has no conductive layer to be connected and the dummy semiconductor layers 104DE are electrically separated from each other between the dummy pixels DPF adjacent in the Y direction. Here, the cross-sectional view taken along the line A-A' of FIG. 20 is identical to FIG. 12.

The width (W2) of the dummy semiconductor layer 104DE in the dummy pixel area DA is larger than that in the embodiment and the modified examples 1 to 4. It is preferable that W1≥W2; however, it is not restricted to this. The area of the dummy semiconductor layer 104DE is increased to widen the channel width of the dummy semiconductor layer 104DE of the dummy pixel DPF more than the channel width of the semiconductor layer 104 of the pixel PIA. According to this, the intersection area with the gate line 106 gets larger and its capacity is increased, hence to take a countermeasure against the ESD while reducing the layout space.

Modified Example 7

A seventh modified example (the modified example of the modified example 5 and hereinafter, referred to as a modified example 7) of the embodiment will be described using FIGS. 21 and 22.

Figure 21:
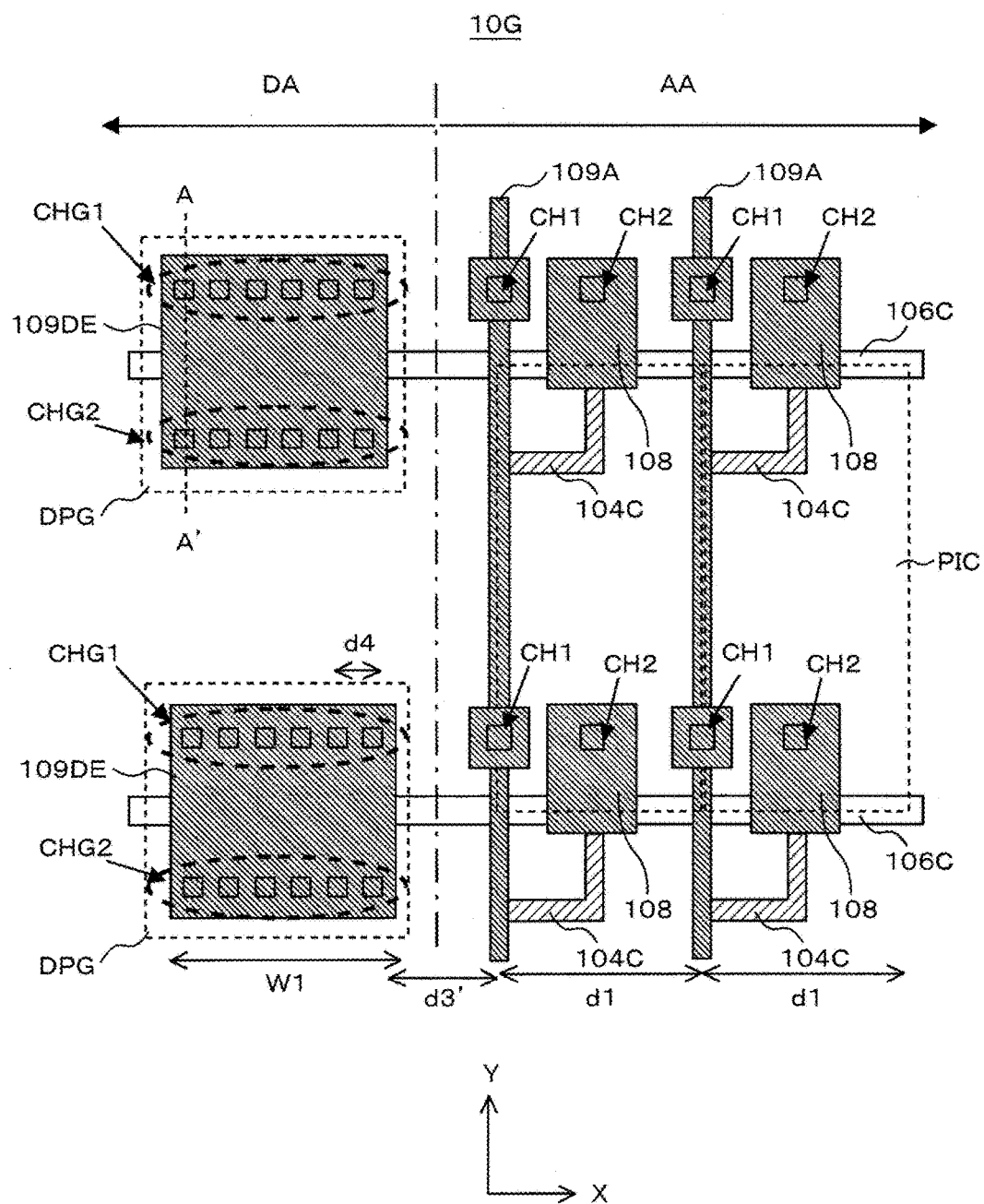
FIG. 21 is a top plan view for use in describing a display device according to a modified example 7.
Figure 22:
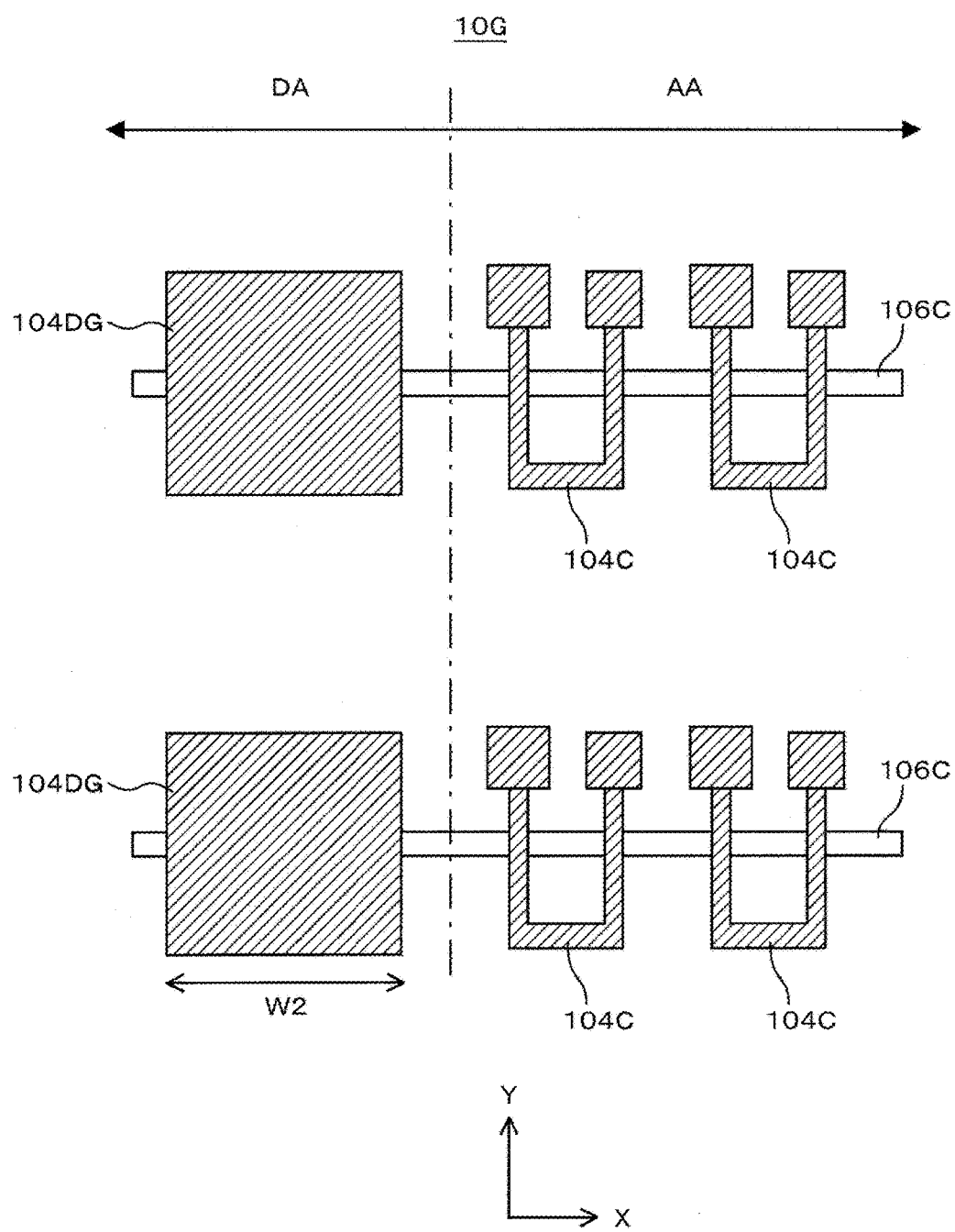
FIG. 22 is a top plan view for use in describing the display device according to the modified example 7.

FIGS. 21 and 22 are top plan views for use in describing an array substrate according to the modified example 7, showing a wiring pattern. FIG. 22 is a top plan view with the pattern of the signal lines and the contact holes eliminated from the view of FIG. 21.

A display device according to the modified example 7 uses an array substrate 10G described later, instead of the substrate 10 of the display device 100 according to the embodiment. In the pixel PIA and the dummy pixel DPE on the array substrate 10E according to the modified example 5, the gate line 106 is formed on each of the semiconductor layers 104 and 104DE through the gate insulating layer 105. On the other hand, in the pixel PIC on the array substrate 10G according to the modified example 7, the semiconductor layer 104C is formed on the gate line 106C through the gate insulating layer 105. In the dummy pixel (second pixel, fourth pixel) DPG, the semiconductor layer (second semiconductor layer, fourth semiconductor layer) 104DG is formed on the gate line 106C through the gate insulating layer 105. Therefore, the contact holes CH1 and CH2 and the contact hole groups of CHG1 and CHG1 are arranged in the interlayer insulating layer 107. Except for this, the array substrate 10G according to the modified example 7 is basically identical to the array substrate 10E according to the modified example 5. The dummy semiconductor layers 104DG are electrically separated from each other between the dummy pixels DPG adjacent in the Y direction. Here, the cross-sectional view taken along the line A-A' of FIG. 21 is identical to FIG. 15.

The metal layer is not arranged on the interlayer insulating film 107 but may be directly formed on the semiconductor layer. The area of the dummy semiconductor layer 104DG is increased to widen the channel width of the dummy semiconductor layer 104DG of the dummy pixel DPG more than the channel width of the semiconductor layer 104C of the pixel PIC. According to this, the intersection area with the gate line 106C gets larger and its capacity is increased, hence to take a countermeasure against the ESD while reducing the layout space.

Modified Example 8

An eighth modified example (the modified example of the modified example 7 and hereinafter, referred to as a modified example 8) of the embodiment will be described using FIG. 23.

Figure 23:
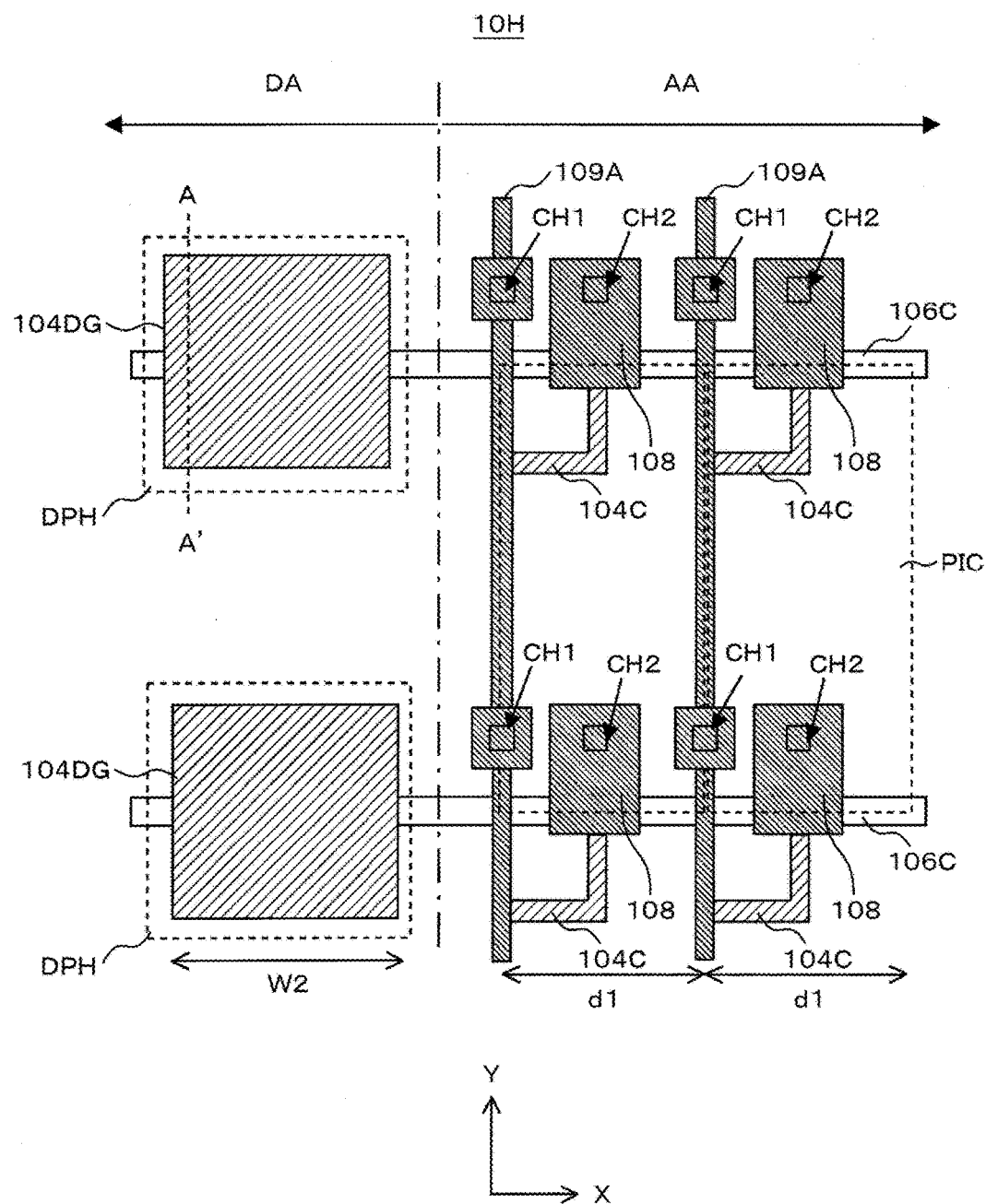
FIG. 23 is a top plan view for use in describing a display device according to a modified example 8.

FIG. 23 is a top plan view for use in describing an array substrate according to the modified example 8, showing a wiring pattern.

A display device according to the modified example 8 uses an array substrate 10H described later, instead of the array substrate 10 of the display device 100 according to the embodiment. In the dummy pixel DPG on the array substrate 10G according to the modified example 7, the dummy semiconductor layer 104DG is arranged under the dummy signal line 109DE, in a way of being covered with the dummy signal line 109DE, and connected to the dummy signal line 109DE at the two positions of the contact hole groups of CHG1 and CHG2. On the other hand, as illustrated in FIG. 23, the dummy pixel DPH on the array substrate 10H according to the modified example 8 does not include the dummy signal line 109DE and the contact hole groups of CHG1 and CHG2. Except for this, the array substrate 10H according to the modified example 8 is basically identical to the array substrate 10G according to the modified example 7. The dummy semiconductor layer 104DG has no conductive layer to be connected and the dummy semiconductor layers 104DG are electrically separated from each other between the dummy pixels DPH adjacent in the Y direction. Here, the cross-sectional view taken along the line A-A' of FIG. 23 is identical to FIG. 17.

As mentioned above, in the embodiment, a liquid crystal display has been described, by way of example, as a display device; however, it is not restricted to a liquid crystal display but an organic EL typed display device and the other display device will do. Further, the above mentioned modified examples are not restricted to the single use but a proper combination of the respective modified examples may be used. For example, the embodiment or one of the modified examples 1 to 4 may be used for the dummy pixel area positioned at one end of the display area and one of the modified examples 5 to 8 may be used for that on the other side of the display area. The embodiment or the modified example may be used variously for every gate line or a plurality of embodiment and modified examples may be used for one gate line.

What is claimed is:

1. A display device comprising:
a display area including a plurality of pixels; and
a dummy pixel area including a plurality of dummy pixels, which is arranged outside of the display area,
wherein the pixel includes
a thin film transistor including a first semiconductor layer,
a gate line connected to a gate electrode of the thin film transistor, and
a signal line connected to a drain electrode of the thin film transistor,
wherein the dummy pixel includes
the gate line,
a plurality of second semiconductor layers crossing the gate line, and
a plurality of dummy signal lines crossing the gate line,
wherein the dummy signal lines are arranged on the second semiconductor layer,
wherein an insulating layer is formed between the dummy signal lines and the second semiconductor layer,
wherein an interval of the dummy signal lines is narrower than an interval of the signal lines, and
wherein the dummy signal line is connected to the second semiconductor layer through a contact hole.

2. The display device according to claim 1,
wherein the contact hole has two contact holes, and
the two contact holes are arranged with the gate line interposed between the two in plan view.

3. The display device according to claim 2,
wherein the second semiconductor layer is formed in the same layer with the same width as the first semiconductor layer in an intersection portion with the gate line.

4. The display device according to claim 2,
wherein the dummy signal line is formed in the same layer with the same width as the signal line.

5. The display device according to claim 1,
wherein the first and the second semiconductor layers are formed in a lower layer than the gate line.

6. The display device according to claim 1,
wherein the first and the second semiconductor layers are formed in an upper layer than the gate line.

7. The display device according to claim 1,
wherein the first and the second semiconductor layers are formed of low-temperature polycrystalline silicon or amorphous silicon.

8. The display device according to claim 1,
wherein the pixel includes a pixel electrode and a common electrode.

9. A display device comprising:
a display area including a plurality of pixels; and
a dummy pixel area including a plurality of dummy pixels, which is arranged outside of the display area,
wherein the pixel includes
a thin film transistor including a first semiconductor layer,
a gate line connected to a gate electrode of the thin film transistor, and
a signal line connected to a drain electrode of the thin film transistor,
wherein the dummy pixel includes
the gate line,
a plurality of second semiconductor layer crossing the gate line, and
a plurality of dummy signal line crossing the gate line,
wherein the dummy signal lines are arranged on the second semiconductor layer,
wherein an insulating layer is formed between the dummy signal lines and the second semiconductor layer,
wherein the dummy signal line is connected to the second semiconductor layer through a plurality of a contact holes, and
wherein one of the plurality of the contact holes is arranged along the dummy signal line crossing the gate line and on an opposite side from the other one of the plurality of the contact holes with respect to the gate line in plan view.

10. The display device according to claim 9,
wherein the second semiconductor layer is formed in the same layer as the first semiconductor layer with a larger width than the width of the first semiconductor layer in the intersection portion with the gate line.

11. The display device according to claim 10, wherein the dummy signal line is formed in the same layer as the signal line with a larger width than the width of the signal line.

* * * * *